United States Patent
Yoshikawa et al.

(10) Patent No.: US 9,390,766 B2
(45) Date of Patent: Jul. 12, 2016

(54) SEMICONDUCTOR DEVICE AND ELECTRONIC DEVICE

(75) Inventors: Yasuhiro Yoshikawa, Kanagawa (JP); Motoo Suwa, Kanagawa (JP); Kazuhiko Hiranuma, Kanagawa (JP)

(73) Assignee: Renesas Electronics Corporation, Tokyo (JP)

(*) Notice: Subject to any disclaimer, the term of this patent is extended or adjusted under 35 U.S.C. 154(b) by 990 days.

(21) Appl. No.: 13/372,425

(22) Filed: Feb. 13, 2012

(65) Prior Publication Data

US 2012/0206954 A1 Aug. 16, 2012

(30) Foreign Application Priority Data

Feb. 15, 2011 (JP) ................. 2011-029514

(51) Int. Cl.
 *G11C 5/06* (2006.01)
(52) U.S. Cl.
 CPC ....... *G11C 5/063* (2013.01); *H01L 2224/32225* (2013.01); *H01L 2224/48465* (2013.01); *H01L 2224/73265* (2013.01)
(58) Field of Classification Search
 CPC ........................................................ G11C 5/06
 See application file for complete search history.

(56) References Cited

U.S. PATENT DOCUMENTS

| 7,161,820 | B2 | 1/2007 | Funaba et al. |
| 7,447,038 | B2 | 11/2008 | Uematsu et al. |
| 8,487,444 | B2 * | 7/2013 | Law ................. H01L 21/76898 257/686 |
| 2008/0237848 | A1 * | 10/2008 | Yoshikawa ............... G11C 5/02 257/723 |

FOREIGN PATENT DOCUMENTS

| JP | 2004-62725 A | 2/2004 |
| JP | 2006-173409 A | 6/2006 |
| JP | 2008-4579 A | 1/2008 |
| JP | 2008-293206 A | 12/2008 |
| JP | 2009-260195 A | 11/2009 |

OTHER PUBLICATIONS

Office Action (Notification of Reasons for Refusal) issued Apr. 3, 2014, in Japanese Patent Application No. 2011-029514.

* cited by examiner

*Primary Examiner* — Fernando L Toledo
*Assistant Examiner* — Lawrence-Linh T Nguyen
(74) *Attorney, Agent, or Firm* — Shapiro, Gabor and Rosenberger, PLLC

(57) ABSTRACT

There is a need to provide a semiconductor device and an electronic device capable of easily allowing a bypass capacitor to always improve noise suppression on a signal path in order to transmit a reference potential between chips in different power supply noise states. There is provided a specified signal path that connects a control chip and a memory chip mounted on a mounting substrate and transmits a reference potential generated from the control chip. A bypass capacitor is connected to the specified signal path only at a connecting part where a distance from a reference potential pad of the memory chip to the connecting part along the specified signal path is shorter than a distance from a reference potential pad of the control chip to the connecting part along the specified signal path.

8 Claims, 13 Drawing Sheets

SEMICONDUCTOR DEVICE AND ELECTRONIC DEVICE

CROSS-REFERENCE TO RELATED APPLICATIONS

The disclosure of Japanese Patent Application No. 2011-29514 filed on Feb. 15, 2011 including the specification, drawings and abstract is incorporated herein by reference in its entirety.

BACKGROUND

The present invention relates to a semiconductor device and an electronic device using a reference potential for logical value determination levels corresponding to interface signals for semiconductor chips. More particularly, the invention relates to a technology appropriately applicable to a semiconductor device mounted with a memory chip and a control chip in accordance with an SiP (System In Package) or POP (Package On Package) technique.

A reference potential may be used to determine logical values corresponding to interface signals for multiple semiconductor chips such as a memory chip and a control chip. A resistance voltage division circuit for power supply voltage can be used outside the semiconductor chips to generate the reference potential and supply it to each of the semiconductor chips. However, a large through-current flows when the resistance voltage division circuit using discrete devices generates the reference potential outside the semiconductor chips. This hinders energy saving for battery-driven mobile terminals. To solve this problem, patent document 1 discloses the configuration that provides a reference potential generation circuit inside the semiconductor chip and allows this chip to supply a reference potential to other chips. Patent document 2 discloses the configuration that provides a memory controller with a logical threshold voltage output circuit as a reference potential generation circuit and supplies a reference potential generated from this circuit to an on-chip terminated DRAM chip. Patent document 3 describes the reference potential generation circuit independently provided for each of a memory chip and a control chip mounted on a semiconductor device. Patent document 4 describes the memory module including a decoupling capacitor near a reference potential pin of a memory chip.

Patent document 1: Japanese Unexamined Patent Publication No. 2008-293206

Patent document 2: Japanese Unexamined Patent Publication No. 2004-62725

Patent document 3: Japanese Unexamined Patent Publication No. 2008-4579

Patent document 4: Japanese Unexamined Patent Publication No. 2006-173409

The inventors examined noise suppression when a reference potential generated from one semiconductor integrated circuit is supplied to the other semiconductor integrated circuits. Patent document 1 describes no considerations about the noise suppression on signal paths for transmitting the reference potential. Normally, the bypass capacitor as exemplified in patent documents 2 through 4 suppresses noises on signal paths. A connecting noise or a power supply noise is superimposed on a signal path. The inventors found that it is not always optimal to suppress noises at any position of the signal path. For example, let us suppose that a power supply noise varies the power supply voltage. A signal subject to the power supply variation is preferably processed if the reference potential as a determination level is also subject to a level variation. Let us consider that one semiconductor integrated circuit outputs the reference potential from an output buffer to a signal path and transmits it to another semiconductor integrated circuit and that the former semiconductor integrated circuit delays the reference potential on the signal path and supplies it as a feedback input to an input terminal. The same power supply noise is not expected to be superimposed in an input buffer on the feedback input path if a bypass capacitor is provided near the output side of the signal path to suppress power supply noise components in the reference potential. The inventors found that the feedback-input reference potential might not be used as the signal level determination reference when the reference potential is output. For example, such a case applies when a reference potential is supplied as feedback input to a semiconductor integrated circuit having the self-test function that verifies the reference potential once output outside the chip.

It is an object of the invention to provide a semiconductor device and an electronic device capable of easily allowing a bypass capacitor to always improve noise suppression on a signal path in order to transmit a reference potential between chips in different power supply noise states.

These and other objects and novel features of the invention may be readily ascertained by referring to the following description and appended drawings.

The following summarizes representative aspects of the invention disclosed in this application.

There is provided a specified signal path that connects a control chip and a memory chip mounted on a mounting substrate and transmits a reference potential generated from the control chip. A bypass capacitor is connected to the specified signal path only at a connecting part where a distance from a reference potential pad of the memory chip to the connecting part along the specified signal path is shorter than a distance from a reference potential pad of the control chip to the connecting part along the specified signal path.

According to this restriction, the bypass capacitor more greatly suppresses noises on the reference potential toward the memory chip prone to different power supply noise states than toward the control chip. The reference potential as a criterion becomes more stable on the memory chip. The control chip may receive a feedback of the reference potential and use the feedback for the determination. The feedback reference potential can retain traces of the power supply noise and provide a criterion for signals influenced by the power supply noise.

The following summarizes an effect provided by the representative aspects of the invention disclosed in this application.

The positional restriction on the bypass capacitor makes it possible to allow the bypass capacitor to easily improve noise suppression on a signal path in order to transmit a reference potential between chips in different power supply noise states.

DETAILED DESCRIPTION

1. Outline of Embodiments

Figure 1:
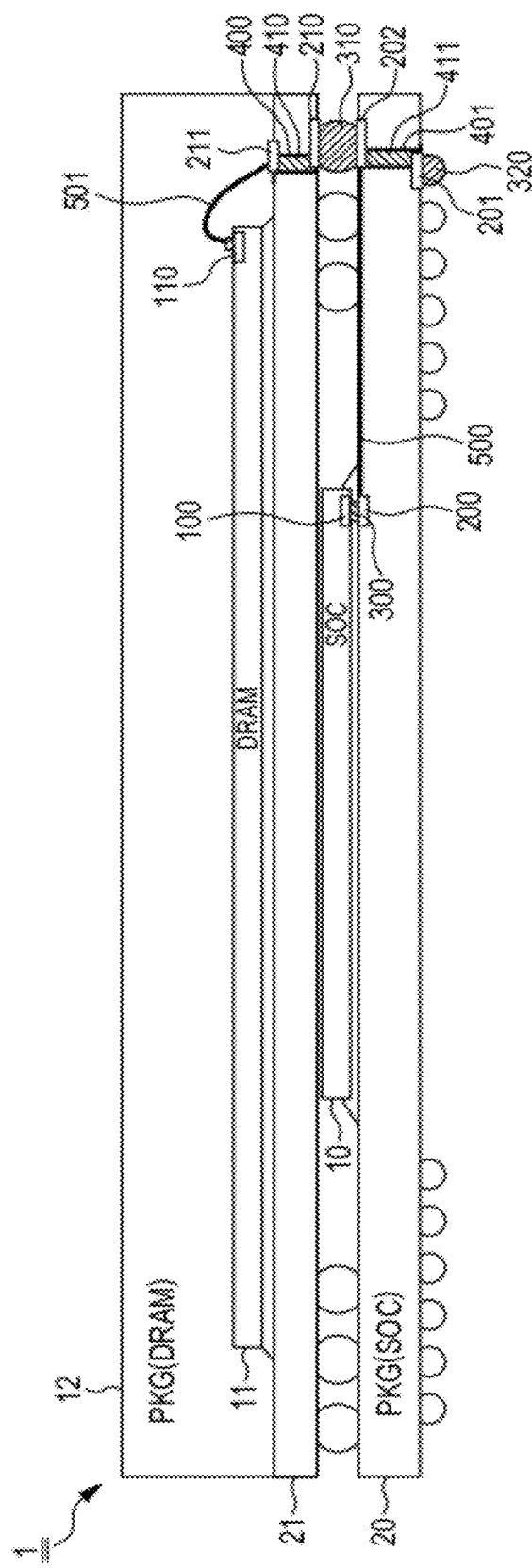
FIG. 1 is a cross sectional view of a POP-structured semiconductor device.

The following outlines representative embodiments of the invention disclosed in this specification. In the following description, parenthesized reference numerals correspond to those shown in the appended drawings and just denote examples belonging to the concept of the corresponding components.

<1> A Semiconductor Device on a POP-Structured Base Substrate where a Vref Bypass Capacitor is Connected Toward a Memory Chip A semiconductor device according to a representative embodiment of the invention includes: a wiring substrate (20: base substrate or lower substrate) having an upper surface (chip mounting side), multiple control chip electrodes formed on the upper surface, multiple memory chip electrodes formed on the upper surface, a lower surface (component side) opposite the upper surface, multiple external terminal electrodes formed on the lower surface, multiple vias formed between the upper surface and the lower surface, and multiple via wirings formed inside of the vias, respectively, and electrically connecting the control chip electrodes and the memory chip electrodes with the external terminal electrodes, respectively; a control chip (10) having a reference potential generation circuit, a chip front surface (upper surface or principal surface), multiple electrode pads (bonding pads) formed on the chip front surface, a chip rear surface on the opposite side of the chip front surface, and mounted on the upper surface of the wiring substrate; multiple conductive members (300: bump electrodes) electrically connecting the electrode pads (100) of the control chip with the control chip electrodes (200); and multiple external terminals connected to the external terminal electrodes of the wiring substrate, respectively. The electrode pads each have a first reference potential pad (100) electrically connected to the reference potential generation circuit. The control chip electrodes have a first reference potential electrode (200) electrically connected to the first reference potential pad of the control chip. The memory chip electrodes have a second reference potential electrode (202) electrically connected to a second reference potential pad (110) of a memory chip. A reference potential terminal electrode of the external terminal electrodes, which is electrically connected to a bypass capacitor, is electrically connected to the first reference potential electrode and the second reference potential electrode through a reference potential wiring (500) of the wirings formed in the wiring substrate and a reference potential via wiring (411) of the via wirings, respectively. The reference potential via wiring is connected only at a connecting part of the reference potential wiring where a distance on the reference potential wiring from the connecting part to the second reference potential electrode is shorter than a distance on the reference potential wiring from the connecting part to the first reference potential electrode. The embodiment has described the example of mounting the control chip on the upper surface of the wiring substrate so that the surface (for forming electrode pads) of the control chip faces the upper surface of the wiring substrate. Further, the control chip may be mounted on the upper surface of the wiring substrate so that the reverse side of the control chip faces the upper surface of the wiring substrate. In this case, the electrode pads (100) and the control chip electrodes (200) of the control chip as conductive members are electrically connected to each other through wires.

The semiconductor device configures a POP-structured base substrate (lower part), for example. A semiconductor device (upper part) having a memory chip is provided (mounted) on the lower part through memory chip electrodes to configure a POP-structured multi-chip module. A connecting part is provided between the reference potential via wiring for connecting the bypass capacitor and the reference potential wiring. A distance from the connecting part to the first reference potential electrode is restricted to be shorter than a distance from the connecting part to the second reference potential electrode. If the semiconductor device having the memory chip configures a multi-chip module, the restriction is applied to the connecting part between the reference potential via wiring for connecting the bypass capacitor and the reference potential wiring. The restriction at least guarantees the distance from the connecting part to the first reference potential pad for the control chip to be shorter than the distance from the connecting part to the second reference potential pad for the memory chip. Such a guarantee is unavailable if the positional restriction is reversed. According to the multi-chip module configured under this restriction, the bypass capacitor more greatly suppresses noises on the reference potential toward the memory chip prone to different power supply noise states than toward the control chip. The reference potential as a criterion increases the stability toward the memory chip. The control chip may receive a feedback of the reference potential and use the feedback for the determination. In this case, the feedback reference potential can retain traces of the power supply noise and provide a criterion for signals influenced by the power supply noise. The positional restriction can allow the bypass capacitor to easily improve noise suppression on the signal path in order to transmit the reference potential between the chips in different power supply noise states.

<2> Short-Circuiting Vref Output and Vref Input

On the semiconductor device according to item 1, the first reference potential pad includes: a first reference potential output pad (100_OUT) connected to an output terminal of an output circuit that outputs a reference potential generated from the reference potential generation circuit; and a first reference potential input pad (100_IN) connected to an input terminal of an input circuit that is connected adjacently to the first reference potential output pad.

The embodiment represents a case where the control chip receives a feedback of the reference potential and uses the feedback for the determination.

<3> DQ-Compliant Vref

The semiconductor device according to item 2 further includes a data-oriented pad as the electrode pad for a data-oriented signal. The first reference potential pad (100_IN_DQa, 100_OUT_DQa) provides a logical value determination level of a data-oriented signal that is input and output through the data-oriented pad.

For example, a feedback signal of the reference potential is used to generate timing to determine data read from the memory chip. Alternatively, the semiconductor device supports the self-test function that loops back and verifies the logical value determination level of a command-address-oriented signal during a device test.

<4> CA-Compliant Vref

The semiconductor device according to item 3 further includes a command-address-oriented pad as the electrode pad for a command-address-oriented signal. The first reference potential pad (100_IN_CA, 100_OUT_CA) provides a logical value determination level of a command-address-oriented signal that is output through the command-address-oriented pad.

For example, the semiconductor device supports the self-test function that loops back and verifies the logical value determination level of a command-address-oriented signal during a device test.

<5> POP-Structure having the Vref Bypass Capacitor Toward the Memory Chip

A semiconductor device (1) according to another representative embodiment of the invention includes: a mounting substrate (20) having a control chip electrode (200), a memory interface electrode (202), and an external terminal electrode (201); a control chip (10) that has a control chip pad (100) connected to the control chip electrode and a reference potential generation circuit and is mounted on the mounting substrate; a memory substrate (21) that has a memory chip electrode (211) connected to the memory interface electrode through a conductive member and is stacked on the control chip and is mounted on the mounting substrate; and a memory chip (11) that receives control from the control chip, has a memory chip pad (110) connected to the memory chip electrode through a conductive member, and is mounted on the memory substrate. The control chip pad includes a first reference potential pad (100) electrically connected to the reference potential generation circuit. The control chip electrode includes a first reference potential electrode (200) electrically connected to the first reference potential pad. The memory chip pad includes a second reference potential pad (110). The memory chip electrode includes a second reference potential electrode (211) electrically connected to the second reference potential pad of the memory chip. The external terminal electrode includes a reference potential electrode (201) electrically connected to a bypass capacitor. The reference potential terminal electrode is connected only at a specified connecting part on a signal path that connects the first reference potential pad and the second reference potential pad. A distance from the second reference potential pad to the connecting part along the signal path is shorter than a distance from the first reference potential pad to the connecting part along the signal path.

The above-mentioned semiconductor device has a POP structure, for example. The bypass capacitor is connected to a reference potential terminal electrode. The reference potential terminal electrode is connected to a signal path for reference potentials at a specified connecting part. The distance from the connecting part to the second reference potential pad is restricted to be shorter than the distance from the connecting part to the first reference potential pad. According to this restriction, the bypass capacitor more greatly suppresses noises on the reference potential toward the memory chip prone to different power supply noise states than toward the control chip. The reference potential as a criterion becomes more stable on the memory chip. The control chip may receive a feedback of the reference potential and use the feedback for the determination. The feedback reference potential can retain traces of the power supply noise and provide a criterion for signals influenced by the power supply noise. The positional restriction makes it possible to allow the bypass capacitor to easily improve noise suppression on a signal path in order to transmit a reference potential between chips in different power supply noise states.

<6> Short-Circuiting Vref Output and Vref Input

On the semiconductor device according to item 5, the first reference potential pad includes: a first reference potential output pad connected to an output terminal of an output circuit that outputs a reference potential generated from the reference potential generation circuit; and a first reference potential input pad connected to an input terminal of an input circuit that is connected adjacently to the first reference potential output pad.

The embodiment represents a case where the control chip receives a feedback of the reference potential and uses the feedback for the determination.

<7> DQ-Compliant Vref

The semiconductor device according to item 6 further includes a data-oriented pad as the control chip pad for a data-oriented signal. The first reference potential pad provides a logical value determination level of a data-oriented signal that is input and output through the data-oriented pad.

For example, a feedback signal of the reference potential is used to generate timing to determine data read from the memory chip. Alternatively, the semiconductor device supports the self-test function that loops back and verifies the logical value determination level of a command-address-oriented signal during a device test.

<8> CA-Compliant Vref

The semiconductor device according to item 7 further includes a command-address-oriented pad as the control chip pad for a command-address-oriented signal. The first reference potential pad provides a logical value determination level of a command-address-oriented signal that is output through the command-address-oriented pad.

For example, the semiconductor device supports the self-test function that loops back and verifies the logical value determination level of a command-address-oriented signal during a device test.

<9> SIP-Structure having the Vref Bypass Capacitor Toward the Memory Chip

A semiconductor device according to still another representative embodiment of the invention includes: a mounting substrate (22) having a control chip electrode (200, 204), a memory chip electrode (203, 205), and an external terminal electrode; a control chip (10) that has a control chip pad (100)

connected to the control chip electrode through a conductive member and a reference potential generation circuit and is mounted on the mounting substrate; and a memory chip (11) that receives control from the control chip, has a memory chip pad (110) connected to the memory chip electrode through a conductive member, and is stacked on the control chip and mounted on the memory substrate. The control chip pad includes a first reference potential pad (100) electrically connected to the reference potential generation circuit. The control chip electrode includes a first reference potential electrode (200, 204) electrically connected to the first reference potential pad. The memory chip pad includes a second reference potential pad (110). The memory chip electrode includes a second reference potential electrode (203, 205) electrically connected to the second reference potential pad of the memory chip. The external terminal electrode includes a reference potential electrode (320) electrically connected to a bypass capacitor. The reference potential terminal electrode is connected only at a specified connecting part on a signal path that connects the first reference potential pad and the second reference potential pad. A distance from the second reference potential pad to the connecting part along the signal path is shorter than a distance from the first reference potential pad to the connecting part along the signal path.

The above-mentioned semiconductor device has an SIP structure, for example. The bypass capacitor is connected to a reference potential terminal electrode. The reference potential terminal electrode is connected to a signal path for reference potentials at a specified connecting part. The distance from the connecting part to the first reference potential pad is restricted to be shorter than the distance from the connecting part to the second reference potential pad. According to this restriction, the bypass capacitor more greatly suppresses noises on the reference potential toward the memory chip prone to different power supply noise states than toward the control chip. The reference potential as a criterion becomes more stable on the memory chip. The control chip may receive a feedback of the reference potential and use the feedback for the determination. The feedback reference potential can retain traces of the power supply noise and provide a criterion for signals influenced by the power supply noise. The positional restriction makes it possible to allow the bypass capacitor to easily improve noise suppression on a signal path in order to transmit a reference potential between chips in different power supply noise states.

<10> Short-Circuiting Vref Output and Vref Input

On the semiconductor device according to item 9, the first reference potential pad includes: a first reference potential output pad connected to an output terminal of an output circuit that outputs a reference potential generated from the reference potential generation circuit; and a first reference potential input pad connected to an input terminal of an input circuit that is connected adjacently to the first reference potential output pad.

The embodiment represents a case where the control chip receives a feedback of the reference potential and uses the feedback for the determination.

<11> DQ-Compliant Vref

The semiconductor device according to item 10 further includes a data-oriented pad as the control chip pad for a data-oriented signal. The first reference potential pad provides a logical value determination level of a data-oriented signal that is input and output through the data-oriented pad.

For example, a feedback signal of the reference potential is used to generate timing to determine data read from the memory chip. Alternatively, the semiconductor device supports the self-test function that loops back and verifies the logical value determination level of a command-address-oriented signal during a device test.

<12> CA-Compliant Vref

The semiconductor device according to item 11 further includes a command-address-oriented pad as the control chip pad for a command-address-oriented signal. The first reference potential pad provides a logical value determination level of a command-address-oriented signal that is output through the command-address-oriented pad.

For example, the semiconductor device supports the self-test function that loops back and verifies the logical value determination level of a command-address-oriented signal during a device test.

<13> Lay-Flat Electronic Device having the Vref Bypass Capacitor Toward the Memory LSI An electronic device according to yet another representative embodiment of the invention includes: a motherboard (31,31A); a first semiconductor device (12A) that has a control chip (10) provided with a reference potential generation circuit and is mounted on the motherboard; a second semiconductor device (12B) that has a memory chip (11) under control of the control chip and is mounted adjacently to the first semiconductor device on the motherboard; a reference potential signal path that is formed on the motherboard and electrically connects a first reference potential electrode (207) of the first semiconductor device to a second reference potential electrode (217) of the second semiconductor device; and a reference potential bypass capacitor (40) that is mounted on the motherboard and is connected to the reference potential signal path. The reference potential bypass capacitor is connected only at a specified connecting part on the reference potential signal path. A distance from the specified connecting part to a second reference potential electrode pad (100) of the memory chip through the second reference potential electrode along the reference potential signal path is shorter than a distance from the specified connecting part to a first reference potential electrode pad (110) of the memory chip through the first reference potential electrode along the reference potential signal path.

The above-mentioned electronic device includes the semiconductor device and the reference potential bypass capacitor lay-flat mounted on the motherboard, for example. The distance from the connecting part on a signal path for reference potentials to the second reference potential pad is restricted to be shorter than the distance from the connecting part to the first reference potential pad. According to this restriction, the bypass capacitor more greatly suppresses noises on the reference potential toward the memory chip prone to different power supply noise states than toward the control chip. The reference potential as a criterion becomes more stable on the memory chip. The control chip may receive a feedback of the reference potential and use the feedback for the determination. The feedback reference potential can retain traces of the power supply noise and provide a criterion for signals influenced by the power supply noise. The positional restriction makes it possible to allow the bypass capacitor to easily improve noise suppression on a signal path in order to transmit a reference potential between chips in different power supply noise states.

<14> Short-Circuiting Vref Output and Vref Input

The electronic device according to item 13 further includes: a first reference potential output pad connected to an output terminal of an output circuit that outputs a reference potential generated from the reference potential generation circuit; and a first reference potential input pad connected to an input terminal of an input circuit that is connected adjacently to the first reference potential output pad.

The embodiment represents a case where the control chip receives a feedback of the reference potential and uses the feedback for the determination.

<15> DQ-Compliant Vref

On the electronic device according to item 14, the control chip has a data-oriented pad for a data-oriented signal. The first reference potential pad provides a logical value determination level of a data-oriented signal that is input and output through the data-oriented pad.

For example, a feedback signal of the reference potential is used to generate timing to determine data read from the memory chip. Alternatively, the semiconductor device supports the self-test function that loops back and verifies the logical value determination level of a command-address-oriented signal during a device test.

<16> CA-Compliant Vref

On the electronic device according to item 15, the control chip has a command-address-oriented pad for a command-address-oriented signal. The first reference potential pad provides a logical value determination level of a command-address-oriented signal that is output through the command-address-oriented pad.

For example, the semiconductor device supports the self-test function that loops back and verifies the logical value determination level of a command-address-oriented signal during a device test.

<17> Bypass Capacitors Toward VDD and GND with Reference to Half VCCQ as the Center On the electronic device according to item 13, the reference potential generation circuit generates a reference voltage that is half a power supply voltage. The reference potential bypass capacitor includes a first reference potential bypass capacitor provided between a reference potential signal path and a power supply terminal and a second reference potential bypass capacitor provided between a reference potential signal path and a ground terminal.

The reference potential indicates a level equivalent to half a power supply voltage. The transmitted reference potential can be further stabilized toward the memory chip by allowing the bypass capacitors at the power supply side and the ground side to suppress a level variation in the signal path for reference potentials.

<18> Mounting a Bypass Capacitor on the Surface of a Motherboard where its Memory and Controller are Mounted On the electronic device according to item 17, the reference potential bypass capacitor is mounted on a mounting surface of the first semiconductor device and the second semiconductor device of the motherboard.

Circuit devices related to the first semiconductor device and the second semiconductor device can be placed on one side of the motherboard. The other side of the motherboard can be dedicated for mounting other devices having fundamentally different functions.

<19> POP-Structured, SIP-Structured, or Lay-Flat Electronic Device having Memory and a Controller An electronic device according to still yet another representative embodiment of the invention includes: a plurality of semiconductor chips mounted on a mounting substrate; and a plurality of signal paths formed to connect the semiconductor chips. The semiconductor chips include one or more memory chips (11) and a control chip to control the memory chip (10). The control chip has a reference potential generation circuit and a first reference potential pad (100) supplied with a reference potential generated from the reference potential generation circuit. The memory chip has a second reference potential pad (110) and a signal pad and uses a reference potential applied to the second reference potential pad as a level criterion of an input signal supplied from the signal pad. The signal path includes a reference potential signal path that connects the first reference potential pad and the second reference potential pad and is connected with a bypass capacitor. The bypass capacitor is connected to the reference potential signal path only at a specified connecting part where a distance from the second reference potential pad to the specified connecting part along the reference potential signal path is shorter than a distance from the first reference potential pad to the specified connecting part along the reference potential signal path.

The above-mentioned electronic device provides a POP-structured, SIP-structured, or lay-flat multi-chip semiconductor device or an electronic device using the semiconductor device, for example. The bypass capacitor is connected to the signal path for reference potentials at a specified connecting part. A distance from the connecting part to the second reference potential pad is restricted to be shorter than a distance from the connecting part to the first reference potential pad. According to this restriction, the bypass capacitor more greatly suppresses noises on the reference potential toward the memory chip prone to different power supply noise states than toward the control chip. The reference potential as a criterion becomes more stable on the memory chip. The control chip may receive a feedback of the reference potential and use the feedback for the determination. The feedback reference potential can retain traces of the power supply noise and provide a criterion for signals influenced by the power supply noise. The positional restriction makes it possible to allow the bypass capacitor to easily improve noise suppression on a signal path in order to transmit a reference potential between chips in different power supply noise states.

<20> Short-Circuiting Vref Output and Vref Input

On the electronic device according to item 19, the first reference potential pad includes: a first reference potential output pad connected to an output terminal of an output circuit that outputs a reference potential generated from the reference potential generation circuit; and a first reference potential input pad connected to an input terminal of an input circuit that is connected adjacently to the first reference potential output pad.

The embodiment represents a case where the control chip receives a feedback of the reference potential and uses the feedback for the determination.

<21> DQ-Compliant Vref

On the electronic device according to item 20, the control chip has a data-oriented pad for a data-oriented signal. The first reference potential pad provides a logical value determination level of a data-oriented signal that is input and output through the data-oriented pad.

For example, a feedback signal of the reference potential is used to generate timing to determine data read from the memory chip. Alternatively, the semiconductor device supports the self-test function that loops back and verifies the logical value determination level of a command-address-oriented signal during a device test.

<22> CA-Compliant Vref

On the electronic device according to item 21, the control chip has a command-address-oriented pad for a command-address-oriented signal. The first reference potential pad provides a logical value determination level of a command-address-oriented signal that is output through the command-address-oriented pad.

For example, the semiconductor device supports the self-test function that loops back and verifies the logical value determination level of a command-address-oriented signal during a device test.

<23> Bypass Capacitors Toward VDD and GND with Reference to Half VCCQ as the Center On the electronic device according to item 19, the reference potential generation circuit generates a reference voltage that is half a power supply voltage.

The reference potential indicates a level equivalent to half a power supply voltage. It is possible to provide a means for allowing the bypass capacitors at the power supply side and the ground side to suppress a level variation in the signal path for reference potentials so that the transmitted reference potential can be further stabilized toward the memory chip.

2. Details of the Embodiments

The following describes the embodiments in more detail.

First Embodiment

FIG. 1 exemplifies a cross sectional view of a POP-structured semiconductor device. A semiconductor device 1 shown in FIG. 1 includes a base structure and a sub-structure. The base structure includes a control chip (SOC) 10 mounted on a base substrate 20 as a wiring substrate or a mounting substrate. The sub-structure includes a memory chip (DRAM) 11 mounted on a sub-substrate (upper substrate) 21 as a wiring substrate. For example, the sub-structure is equivalent to an SDRAM device mounted on a package such as FPC having JEDEC-standard external terminals. Using the base structure, users can have an POP-structured semiconductor device by mounting an inexpensive standardized memory device on the base structure.

A memory chip 11 is equivalent to DDR3-SDRAM (Double Data Rate 3-Synchronous Random Access Memory), though not limited thereto. A control chip 10 is equivalent to a data processing device such as a microcomputer, though not limited thereto. The microcomputer includes an SDRAM controller for controlling access to the DDR3-SDRAM, a CPU (central processing unit), and an accelerator for image processing and encryption or decryption processing. The SDRAM controller controls an interface between the SDRAM and command addresses or data in response to an SDRAM access request from the CPU or the accelerator. A reference potential is used to determine logical values of an interface signal for interface between the memory chip 11 and the control chip 10 in terms of command addresses or data. The JEDEC standard for DDR3-SDRAM specifies reference potential Vref as VCCQ/2 if a power supply voltage is defined as VCCQ. According to the embodiment, the control chip 10 internally generates the reference potential Vref and supplies it to the memory chip 11 so that the memory chip can determine logical values of an interface signal. The power supply voltage VCCQ is at least meant to be used for the interface between the memory chip 11 and the control chip 10 in common.

The following describes the structure of the semiconductor device 1 mainly based on the configuration for transmitting the reference potential Vref.

The base substrate (lower substrate) 20 includes multiple wiring layers formed of glass epoxy resin, for example. Different wiring layers such as a wiring layer on the surface and a wiring layer on the reverse side are electrically connected to each other through a via 401 and via wiring 411 formed inside the via 401 as representative examples. The surface of the base substrate 20 is provided with electrodes (control chip electrode 200 and memory chip electrode 202) as representative examples. The reverse side is also provided with an electrode (external terminal electrode) 201 as a representative example. Many electrodes are electrically connected to each other as appropriate in order to implement necessary signal transmission functions through wiring 500, the via 401, and the via wiring 411 as representative examples. At the electrode 201 on the reverse side of the base substrate 20, an external terminal 320 such as a solder ball is formed to mount the semiconductor device 1 on a wiring pattern of a motherboard. The external terminal 320 may be available as not only the solder ball (ball-shaped electrode) but also a solder material (including lead-free soldering).

Similarly, the sub-substrate (upper substrate) 21 also includes multiple wiring layers. Different wiring layers such as a wiring layer on the surface and a wiring layer on the reverse side are electrically connected to each other through a via 400 and via wiring 410 filled in the via 400 as representative examples. The surface of the sub-substrate 21 is provided with an electrode 211 as a representative example. The reverse side is also provided with an electrode 210 as a representative example. Many electrodes are electrically connected to each other as appropriate in order to implement necessary signal transmission functions through the via 400 and the via wiring 410 as representative examples.

The control chip 10 includes an electrode pad 100 as a representative example. The electrode pad 100 is provided as a first reference potential pad supplied with a reference potential generated from a reference potential generation circuit. The base substrate 20 includes an electrode 200 as a representative example used for a first reference potential. A conductive member such as a solder bump 300 electrically connects the electrode pad 100 and the electrode 200. On the base substrate 20, wiring 500 is formed from the electrode 200 to the electrode 202 and is used for reference potentials. The electrode 202 is electrically connected to the electrode 201 formed on the reverse side of the base substrate 21 through the via 401 and the via wiring 411. An external terminal 320 is formed at the electrode 201 and is connected to one capacitor electrode of a bypass capacitor through motherboard wiring (not shown).

As a representative example, an electrode pad 110 is included in the memory chip 11 and is equivalent to a second reference potential pad that receives a reference potential from outside. As a representative example, the electrode 211 is included in the sub-substrate 21 and is equivalent to a second reference potential electrode. A conductive member such as a bonding wire 501 electrically connects the electrode pad 110 to the electrode 211. The electrode 211 is electrically connected to the electrode 210 formed on the reverse side of the sub-substrate 21 through the via 400 and the via wiring 410. The electrode 202 on the base substrate 20 is provided with an external terminal 310 such as a solder ball. The electrode 210 on the sub-substrate 21 is connected to the external terminal 310. According to the example of the embodiment, the memory chip is mounted on the upper surface of the wiring substrate so that the reverse side (the surface opposite the surface where electrode pads are formed) of the memory chip faces the upper surface of the wiring substrate (sub-substrate 21). It may be also preferable to mount the memory chip on the upper surface of the wiring substrate (sub-substrate 21) so that the surface of the memory chip faces the upper surface of the wiring substrate (sub-substrate 21). In this case, the bump electrode as a conductive member electrically connects the electrode pads 110 of the memory chip to the electrode 211. The external terminal 310 is not limited to a solder ball (ball-shaped electrode) and may be provided as a columnar conductive member or a solder material (including lead-free soldering).

Figure 2:
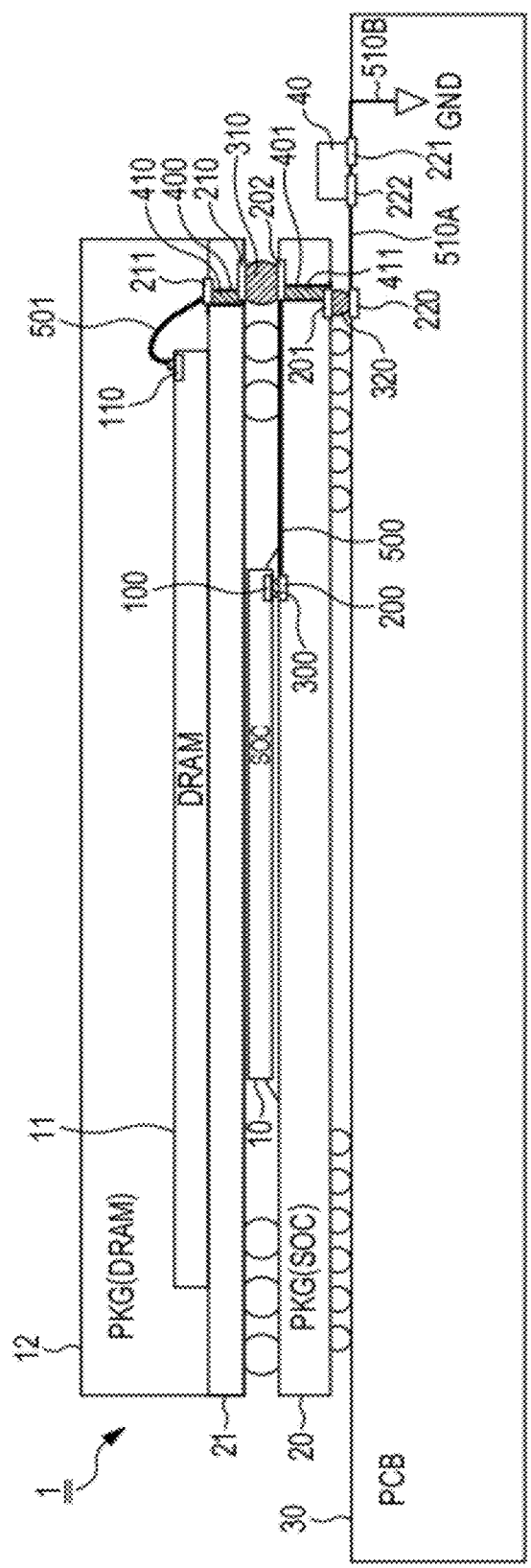
FIG. 2 is a cross sectional view of an electric circuit including the semiconductor device shown in FIG. 1 mounted on a motherboard.

FIG. 2 exemplarily shows an electric circuit including the semiconductor device 1 shown in FIG. 1 mounted on a motherboard 30. The motherboard 30 includes an electrode 220 and wiring 510 where the external terminal 320 as a representative example is mounted. Wiring 510A connects the electrode 220 to an electrode 222. The electrode 222 is connected to one capacitor electrode of a bypass capacitor 40. The other capacitor electrode of the bypass capacitor 40 is connected to an electrode 221. The electrode 221 is connected to a ground plane GND through wiring 510B.

The via 401 and the via wiring 411 are connected to a position on a signal path from the first reference potential pad 100 to the second reference potential pad 110 so as to satisfy the following condition. On the signal path, the via wiring 411 is connected to the wiring 500 only at the position where a distance from the connecting part to the second reference potential pad 110 is shorter than a distance from the connecting part to the first reference potential pad 100.

Figure 3:
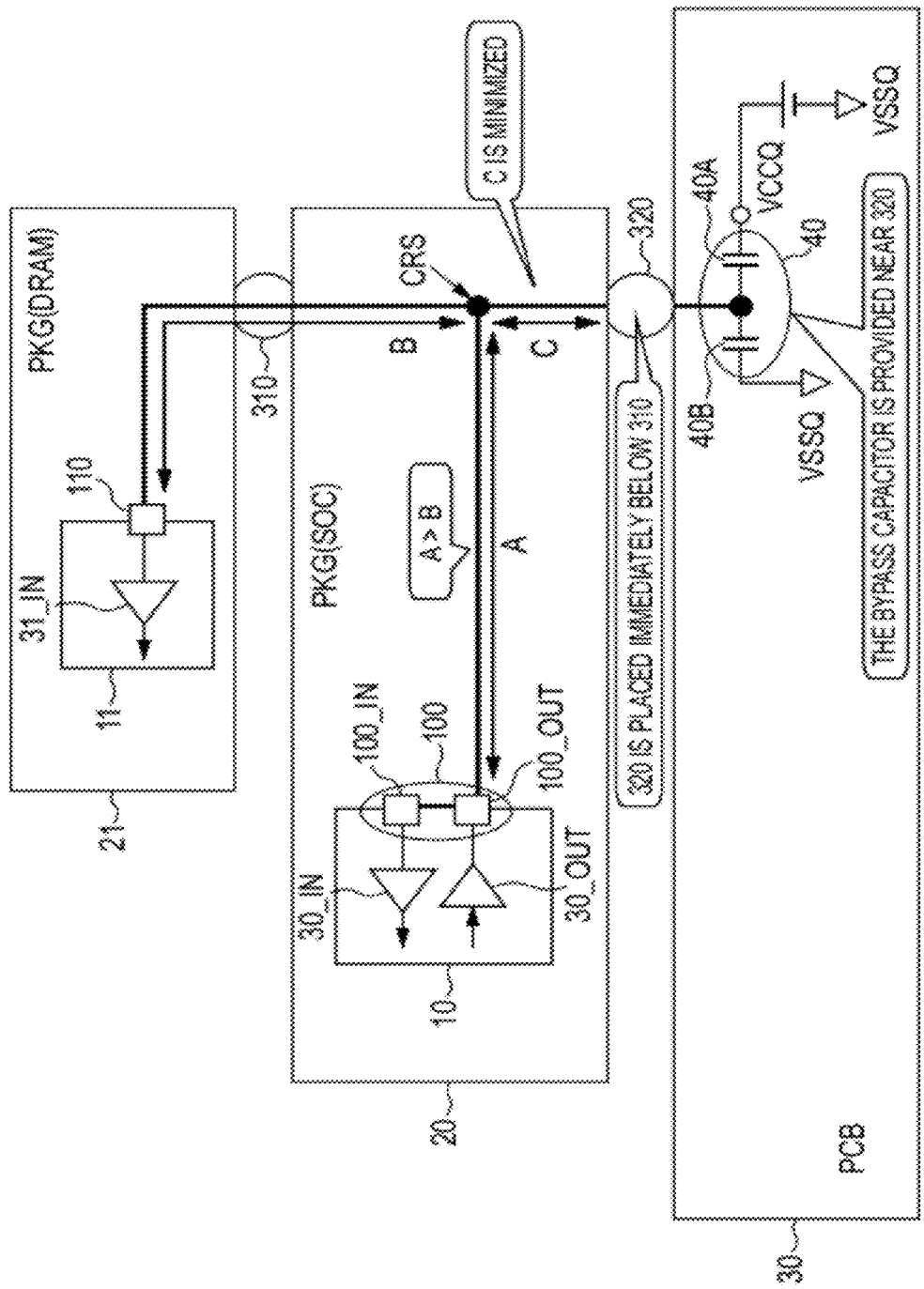
FIG. 3 is an explanatory diagram schematically showing a signal path from a first reference potential pad 100 to a second reference potential pad 110.

FIG. 3 schematically shows the signal path from the first reference potential pad 100 to the second reference potential pad 110. FIG. 3 also shows configurations not clearly shown in FIGS. 1 and 2. The first reference potential pad 100 includes a first reference potential output pad 100_OUT and a first reference potential input pad 100_IN. The first reference potential output pad 100_OUT is connected to an output terminal of an output buffer 30_OUT that outputs the reference potential Vref. The first reference potential input pad 100_IN is connected to an input terminal of an input buffer 30_IN. The adjacent pads 100_OUT and 100_IN are connected to the electrode 200 in common. An input terminal of an input buffer 31_IN is connected to the electrode pad 110 of the memory chip 11 that receives the reference potential. The bypass capacitor 40 for reference potentials includes a first bypass capacitor 40A and a second bypass capacitor 40B. The first bypass capacitor 40A is provided between the electrode 222 connected to the signal path for reference potentials and a power supply terminal VCCQ. The second bypass capacitor 40B is provided between the electrode 222 and a ground terminal VSSQ (ground plane GND). The input buffer 30_IN is connected to a self-test circuit for the reference potential Vref, though not limited thereto.

The via 401 and the via wiring 411 are connected to each other at a branch point CRS in FIG. 3 along the signal path from the first reference potential pad 100 to the second reference potential pad 110. The above-mentioned condition on the signal path for transmitting the reference potential Vref can be expressed as A>B. It is desirable to minimize C. To do this, the external terminal 320 just needs to be provided immediately below the external terminal 310 as seen from the vertical sectional structure shown in FIG. 1. Consequently, it is also desirable to provide the bypass capacitor 40 near the external terminal 320.

Figure 4:
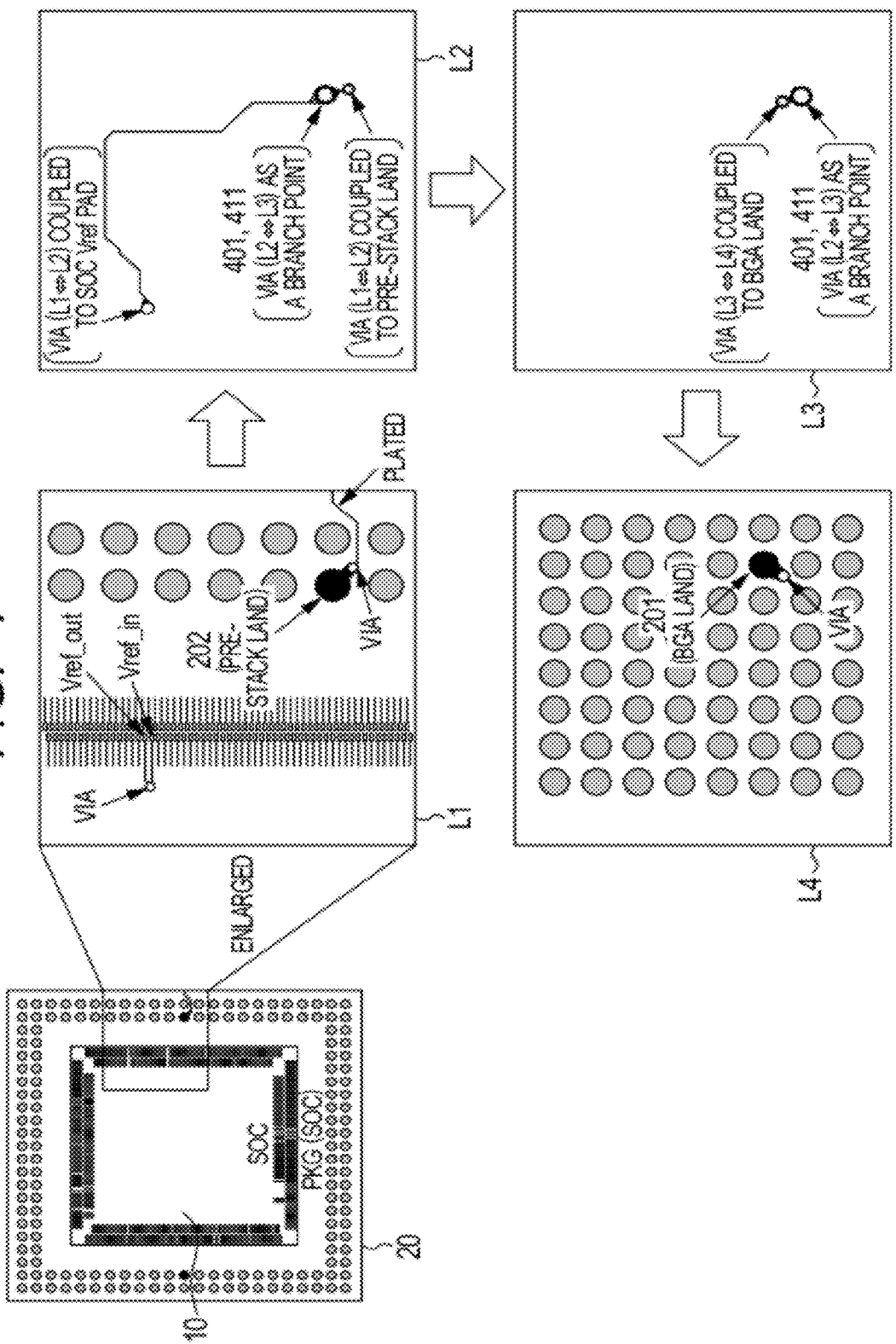
FIG. 4 is an explanatory diagram two-dimensionally showing an example of forming a signal path for reference potential transmission using a 4-layer wiring base substrate 20.

FIG. 4 shows an example of forming a signal path for reference potential transmission using the 4-layer wiring base substrate 20. For example, the base substrate 20 includes a first wiring layer L1, a second wiring layer L2, a third wiring layer L3, and a fourth wiring layer L4, from the surface to the reverse side in order. There is a drawing difference between FIGS. 4 and 1 in terms of the signal path for reference potentials. According to FIG. 4, the electrode 200 is also split corresponding to the electrode pads 100_IN and 100_OUT on the first wiring layer L1. The wirings from these pads are connected at the via and are electrically connected to the wiring for the subordinate layer.

Figure 5:
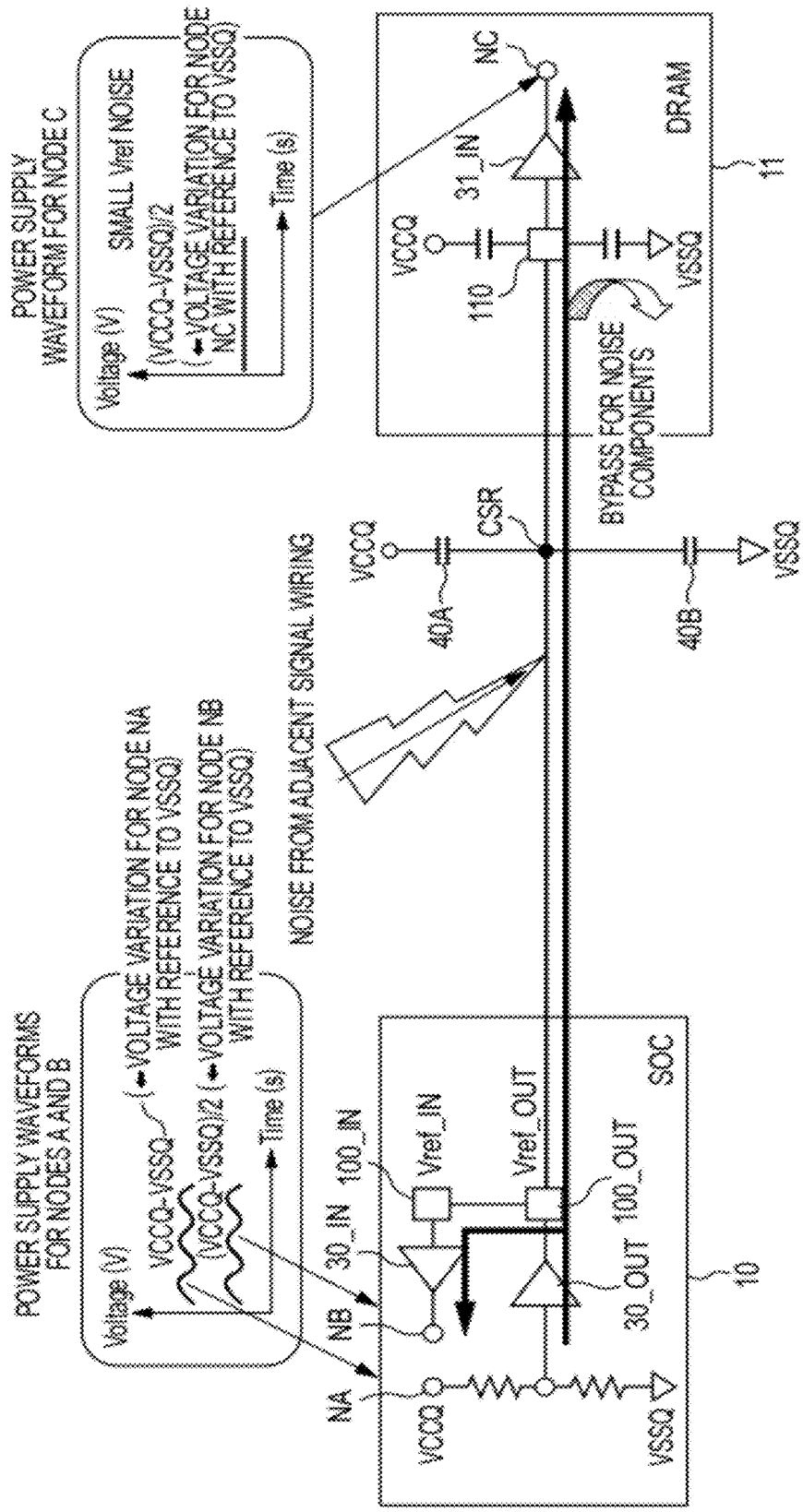
FIG. 5 is an explanatory diagram exemplifying an effect of restricting positions for connecting a bypass capacitor to a signal path for transmitting a reference potential from a control chip to a memory chip.

FIG. 5 exemplifies an effect of restricting positions for connecting the bypass capacitor to the signal path for transmitting a reference potential from the control chip to the memory chip.

A power supply noise from the output buffer 30_OUT is superimposed on the signal path from the electrode pads 100_IN and 100_OUT of the control chip 10 to the electrode pad 110 of the memory chip 11. The signal path is also prone to a connecting noise from an adjacent signal line during signal transmission. The bypass capacitors 40A and 40B are connected to each other at the connecting part CRS specified on the signal path. The signal path is restricted so that the distance from the connecting part CRS to the electrode pad 110 of the memory chip 11 is shorter than the distance from the connecting part CRS to the electrode pads 100_IN and 100_OUT of the control chip 10. According to this restriction, the bypass capacitors 40_A and 40_B more greatly suppress noises on the reference potential Vref toward the memory chip 11 prone to different power supply noise states than toward the control chip 10. The reference potential Vref as a criterion becomes more stable on the memory chip 11. The control chip 10 may receive a feedback of the reference potential Vref from the electrode pad 100_IN through the input buffer 30_IN and use the feedback for the determination. The feedback reference potential can retain traces of the power supply noise and provide a criterion for signals influenced by the power supply noise. For example, the self-test circuit (not shown) provided for the input buffer 30_IN can receive, and verify the reference potential Vref output from the electrode pad 100_OUT while maintaining its power supply noise waveform. An operation of parallel outputting read data might vary the power supply voltage VCCQ and fluctuate the reference potential waveform. In this case, no small delay occurs in the loopback input timing in comparison with the output timing. The loopback needs to maintain the waveform fluctuation in order for the self-test circuit to verify the effect of the fluctuation. At this time, the bypass capacitors 40A and 40B cannot suppress noises toward the control chip 10 from the connecting part CRS. The loopback reference potential can maintain the effect of the power supply noise to be verified.

The POP-structured semiconductor device 1 according to the first embodiment contains the above-mentioned positional restriction on the bypass capacitors 40A and 40B connected to the signal path for reference potential transmission and is capable of allowing the bypass capacitors to easily improve noise suppression on the signal path in order to transmit the reference potential between the chips 10 and 11 in different power supply noise states.

The same also applies to the base structure in itself of the POP-structured base substrate 20. Though not mounted with the sub-substrate 21, the base structure contains the above-mentioned positional restriction on the connecting part CRS for connecting the bypass capacitors, that is, the position of connecting the signal wiring 500 and the via wiring 411. Therefore, the base structure in itself at least guarantees the distance to the reference potential pad 110 for the memory chip 11 to be shorter than the distance to the reference potential pad 100 for the control chip 10 from the position of connecting the via wiring 411 and the reference potential wiring 500. Such a guarantee is unavailable if the positional restriction is reversed. A working effect similar to the above is available only if a POP-structured multi-chip module is configured under the positional restriction. It is possible to allow a bypass capacitor to easily improve noise suppression on a signal path in order to transmit a reference potential between chips in different power supply noise states.

The reference potential output pad 100_OUT is connected to an output terminal of the output buffer 30_OUT that outputs the reference potential Vref. The reference potential input pad 100_IN is connected to the pad 100_OUT adjacently to each other and is connected to an input terminal of the input buffer 30_IN. Short-circuiting the pads 100_OUT and 100_IN enables the self-test circuit provided for the input buffer 30_IN to highly accurately verify the reference potential.

As shown in FIG. 3, the bypass capacitor 40B is connected to ground voltage VSSQ and the bypass capacitor 40A is connected to the power supply voltage VCCQ if the reference potential is equivalent to a half level of the power supply voltage VCCQ. The power supply side and the ground side can suppress level variations in the reference potential signal path using the bypass capacitors 40A and 40B. The reference potential transmitted over the signal path can be further stabilized toward the memory chip 11.

As shown in FIG. 2, the bypass capacitors 40A and 40B are mounted on the mounting surface of the motherboard 30 for mounting the semiconductor device 1. Circuit elements related to the semiconductor device 1 can be provided for one surface of the motherboard 30. The other surface of the motherboard can be dedicated for mounting other devices having fundamentally different functions. As a preferred example applied to mobile telephones, the surface of the motherboard 30 may be mounted with the semiconductor device 1 functioning as an application processor. The reverse side thereof may be mounted with a baseband processor or an RF chip for baseband processing.

Figure 6:
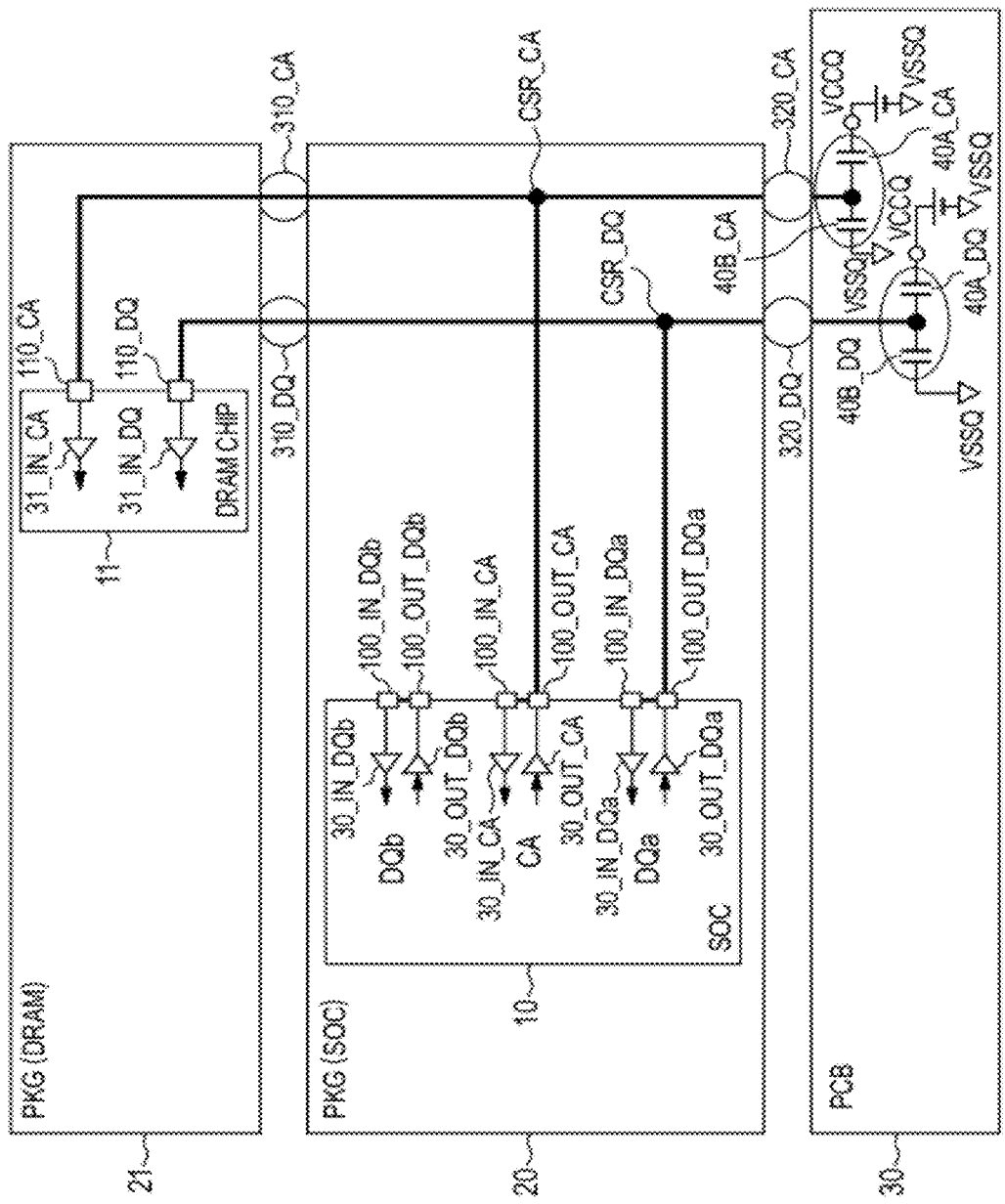
FIG. 6 is an explanatory diagram showing an example of separately providing a reference potential for data-oriented signals and a reference potential for command-address-oriented signals.

FIG. 6 shows an example of separately providing a reference potential for data-oriented signals and a reference potential for command-address-oriented signals.

The control chip 10 is provided with a data-oriented pad for data-oriented signals or data strobe signals in units of data bytes, though not limited thereto. The symbol DQa signifies a high-order byte. The symbol DQb signifies a low-order byte. The control chip 10 can separately output high-order bytes and low-order bytes for a data-oriented reference potential in order to be compatible with two uses, that is, using different memory chips in units of bytes and using one memory chip for high-order bytes and low-order bytes. The control chip 10 includes an output buffer 30_OUT_DQa, an output pad 100_OUT_DQa, an input pad 100_IN_DQa, and an input buffer 30_IN_DQa for the reference potential Vref corresponding to the high-order data byte DQa. Similarly, the control chip 10 includes an output buffer 30_OUT_DQb, an output pad 100_OUT_DQb, an input pad 100_IN_DQb, and an input buffer 30_IN_DQa for the reference potential Vref corresponding to the low-order data byte DQb. If the single memory chip 11 has a 2-byte data input/output function, it may be preferable to use a reference potential input/output system for one of the high-order data byte system and the low-order data byte system as shown in FIG. 6. As seen from FIG. 6, the electrode pads 100_OUT_DQa and 100_IN_DQb for high-order data bytes just need to be connected to the electrode pad 110_DQ of the memory chip 11 as described with reference to FIG. 1. The output pad 100_OUT_DQb for the low-order byte reference potential is connected as feedback to the input pad 100_IN_DQb so as to be capable of self-test.

According to the example of FIG. 6, a command-address-oriented signal CA is output through a command-address-oriented pad for command and address signals. The memory chip 11 is supplied with a logical value determination level of the command-address-oriented signal CA through a path different from that for data-oriented reference potentials. The control chip 10 includes an output buffer 30_OUT_CA, an output pad 100_OUT_CA, an input pad 100_IN_CA, and an input buffer 30_IN_CA for the reference potential Vref corresponding to the command-address-oriented signal CA. Similarly to the data-oriented pads, the electrode pads 100_OUT_CA and 100_IN_CA are connected to each other and are also connected to a reference potential input pad 110_CA for command-address-oriented signals in the memory chip 11. Bypass capacitors 40A_CA and 40B_CA are connected to a connecting part CRS_CA.

The command-address-oriented-oriented reference potential as well as the, data-oriented one can highly accurately support the self-test function that loops back and verifies the logical value determination level of a command-address-oriented signal during a device test.

Figure 7:
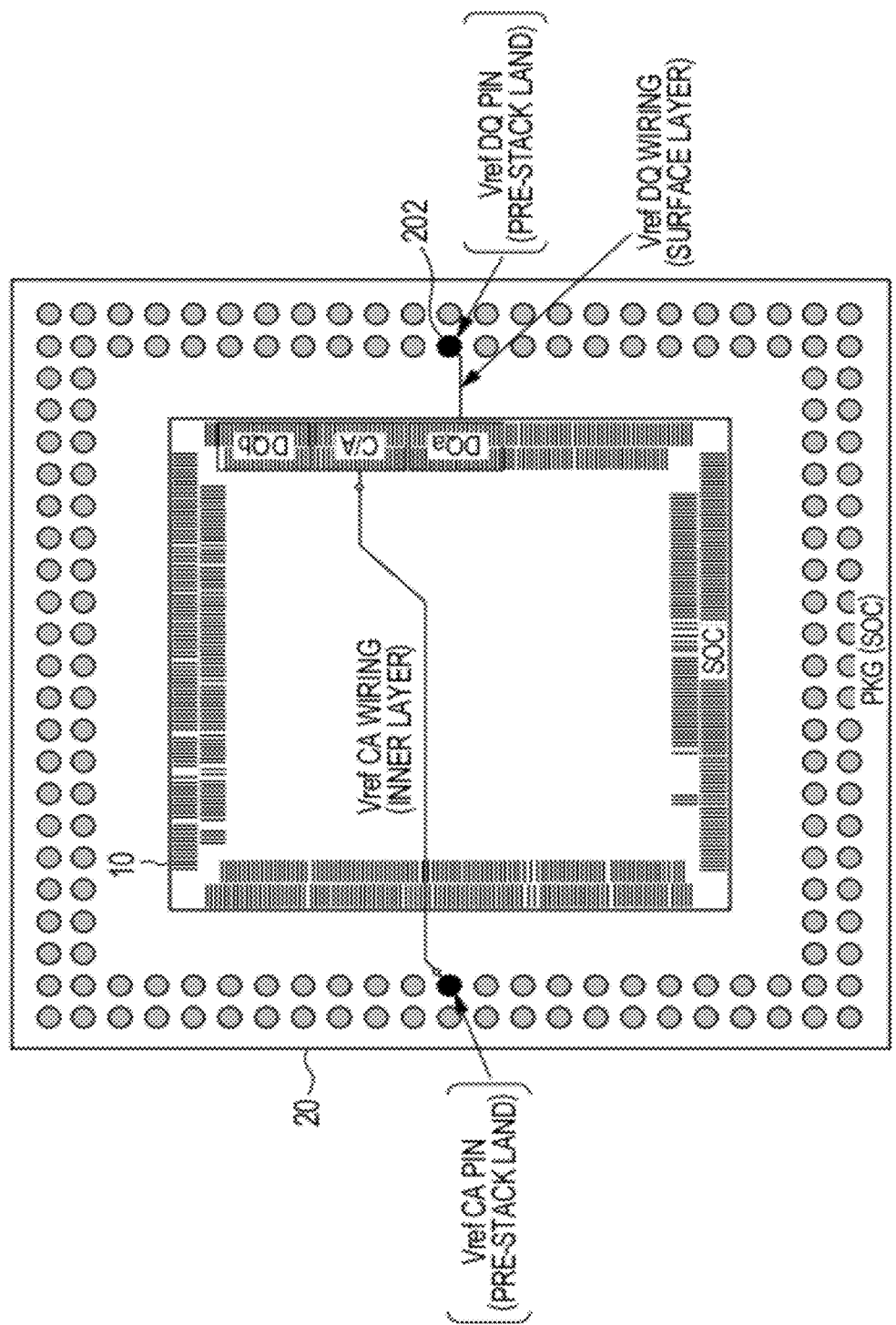
FIG. 7 is a plan view schematically showing a signal path for transmitting the command-address-oriented reference potential in FIG. 6.

FIG. 7 schematically shows a signal path for transmitting the command-address-oriented reference potential in FIG. 6. The description in FIG. 7 corresponds to that in FIG. 4.

Second Embodiment

Figure 8:
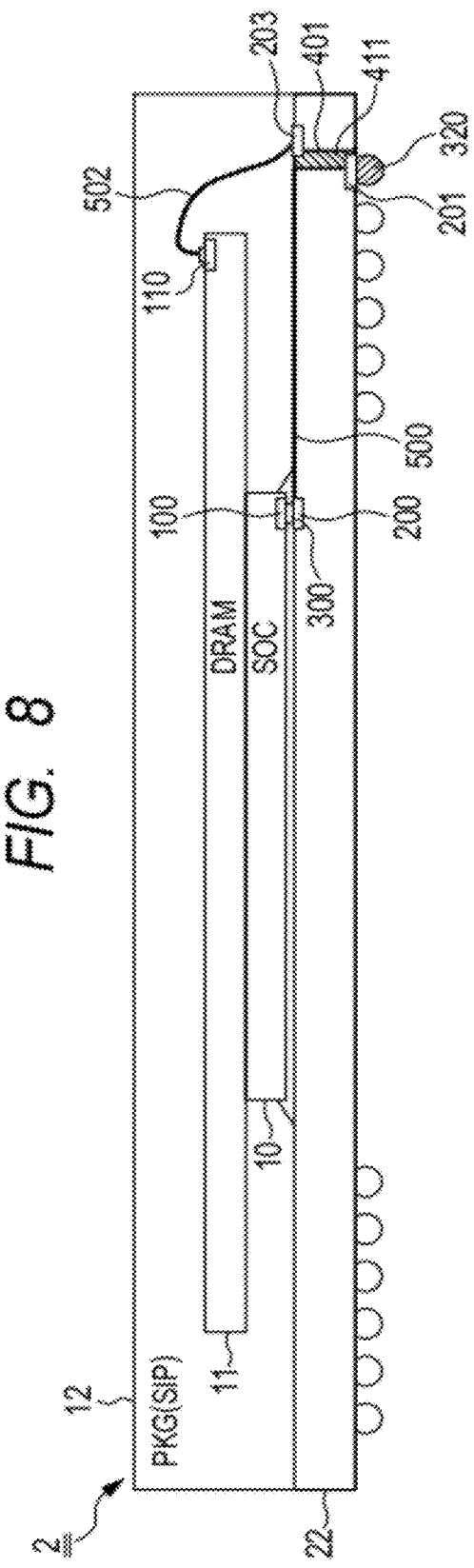
FIG. 8 is a cross sectional view of an SIP-structured semiconductor device.

FIG. 8 exemplifies a cross sectional view of an SIP-structured semiconductor device. A semiconductor device 2 in FIG. 8 is so structured that the control chip (SOC) 10 and the memory chip (DRAM) 11 are stacked and sealed with resin on a module substrate 22 provided as the wiring substrate or the mounting substrate. The memory chip 11 and the control chip 10 are equivalent to those described in the first embodiment. The reference potential Vref is specified as VCCQ/2 if the power supply voltage is defined as VCCQ. The control chip 10 internally generates the reference potential Vref and supplies it to the memory chip 11 so that the memory chip 11 can determine logical values of an interface signal. The following describes the structure of the semiconductor device 2 mainly based on the configuration for transmitting the reference potential Vref.

The module substrate 22 includes multiple wiring layers formed of glass epoxy resin, for example. Different wiring layers such as a wiring layer on the surface and a wiring layer on the reverse side are electrically connected to each other through the via 401 and the via wiring 411 formed inside the via 401 as representative examples. The surface of the module substrate 22 is provided with electrodes 200 and 203 as representative examples. The reverse side is also provided with the electrode 201 as a representative example. Many electrodes are electrically connected to each other as appropriate in order to implement necessary signal transmission functions through the wiring 500, the via 401, and the via wiring 411 as representative examples. At the electrode 201 on the reverse side of the module substrate 22, the external terminal 320 such as a solder ball is formed to mount the semiconductor device 2 on a wiring pattern of a motherboard. The control chip 10 is mounted and fixed to the surface of the module substrate 22. The memory chip 11 is mounted and fixed to the control chip 10. The control chip 10 includes the electrode pad 100 as a representative example. The electrode pad 100 is provided as a first reference potential pad supplied with a reference potential generated from the reference potential generation circuit. The module substrate 22 includes the electrode 200 as a representative example used for the first reference potential. A conductive member such as the solder bump 300 electrically connects the electrode pad 100 and the electrode 200. On the module substrate 22, the wiring 500 is formed from the electrode 200 to the electrode 203 and is used for reference potentials. The electrode 203 is electrically connected to the electrode 201 formed on the reverse side of the module substrate 22 through the via 401 and the via wiring 411. The external terminal 320 is formed at the electrode 201 and is connected to one capacitor electrode of the bypass capacitor 40 through wiring of the motherboard 30 as shown in FIG. 2.

As a representative example, the electrode pad 110 is included in the memory chip 11 and is equivalent to the second reference potential pad that receives a reference potential from outside. As a representative example, the electrode 203 is included in the module substrate 22 and is equivalent to the second reference potential electrode. A conductive member such as a bonding wire 502 electrically connects the electrode pad 110 to the electrode 203.

Figure 9:
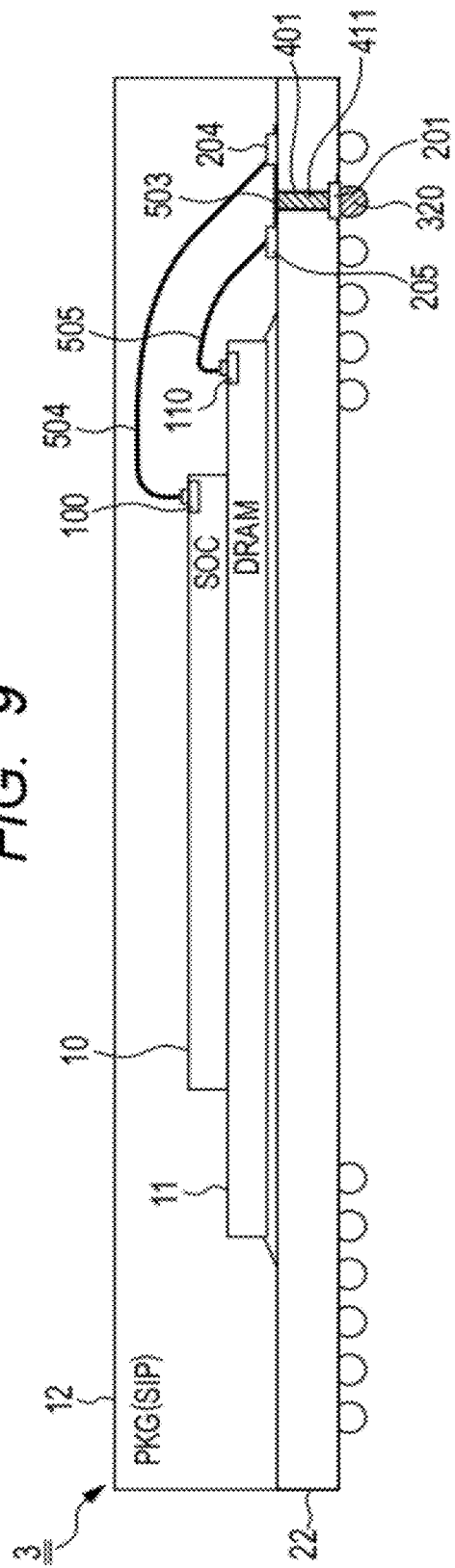
FIG. 9 is a cross sectional view of another SIP-structured semiconductor device.

FIG. 9 exemplifies a cross sectional view of another SIP-structured semiconductor device. As a difference from FIG. 8, a semiconductor device 3 in FIG. 9 includes the memory chip 11 and the control chip 10 that are stacked in the order reverse to that shown in FIG. 8. The module substrate 22 includes multiple wiring layers formed of glass epoxy resin, for example. Different wiring layers such as a wiring layer on the surface and a wiring layer on the reverse side are electrically connected to each other through the via 401 and the via wiring 411 formed inside the via 401 as representative examples. The surface of the module substrate 22 is provided with electrodes 204 and 205 as representative examples. The reverse side is also provided with the electrode 201 as a representative example. Many electrodes are electrically connected to each other as appropriate in order to implement necessary signal transmission functions through wiring 503, the via 401, and the via wiring 411 as representative examples. At the electrode 201 on the reverse side of the module substrate 22, the external terminal 320 such as a solder bump is formed to mount the semiconductor device 3 on a wiring pattern of a motherboard. The memory chip 11 is mounted and fixed to the surface of the module substrate 22. The control chip 10 is mounted and fixed to the memory chip 11. The control chip 10 includes the electrode pad 100 as a representative example. The electrode pad 100 is provided as a first reference potential pad supplied with a reference potential generated from the reference potential generation circuit. The module substrate 22 includes an electrode 204 as a representative example used for the first reference potential. A conductive member such as a bonding wire 504 electrically connects the electrode pad 100 and the electrode 204. As a representative example, the electrode pad 110 is included in the memory chip 11 and is equivalent to the second reference potential pad that receives a reference potential from outside. As a representative example, an electrode 205 is included in the module substrate 22 and is equivalent to the second reference potential electrode. A conductive member such as a bonding wire 505 electrically connects the electrode pad 110 to the electrode 205. On the module substrate 22, the wiring 503 is formed from the electrode 205 to the electrode 204 and is used for reference potentials. The wiring 503 is electrically connected to the electrode 201 formed on the reverse side of the module substrate 22 through the via 401 and the via wiring 411. The external terminal 320 is formed at the electrode 201 and is connected to one capacitor electrode of the bypass capacitor 40 through wiring of the motherboard 30 as shown in FIG. 2.

Figure 10:
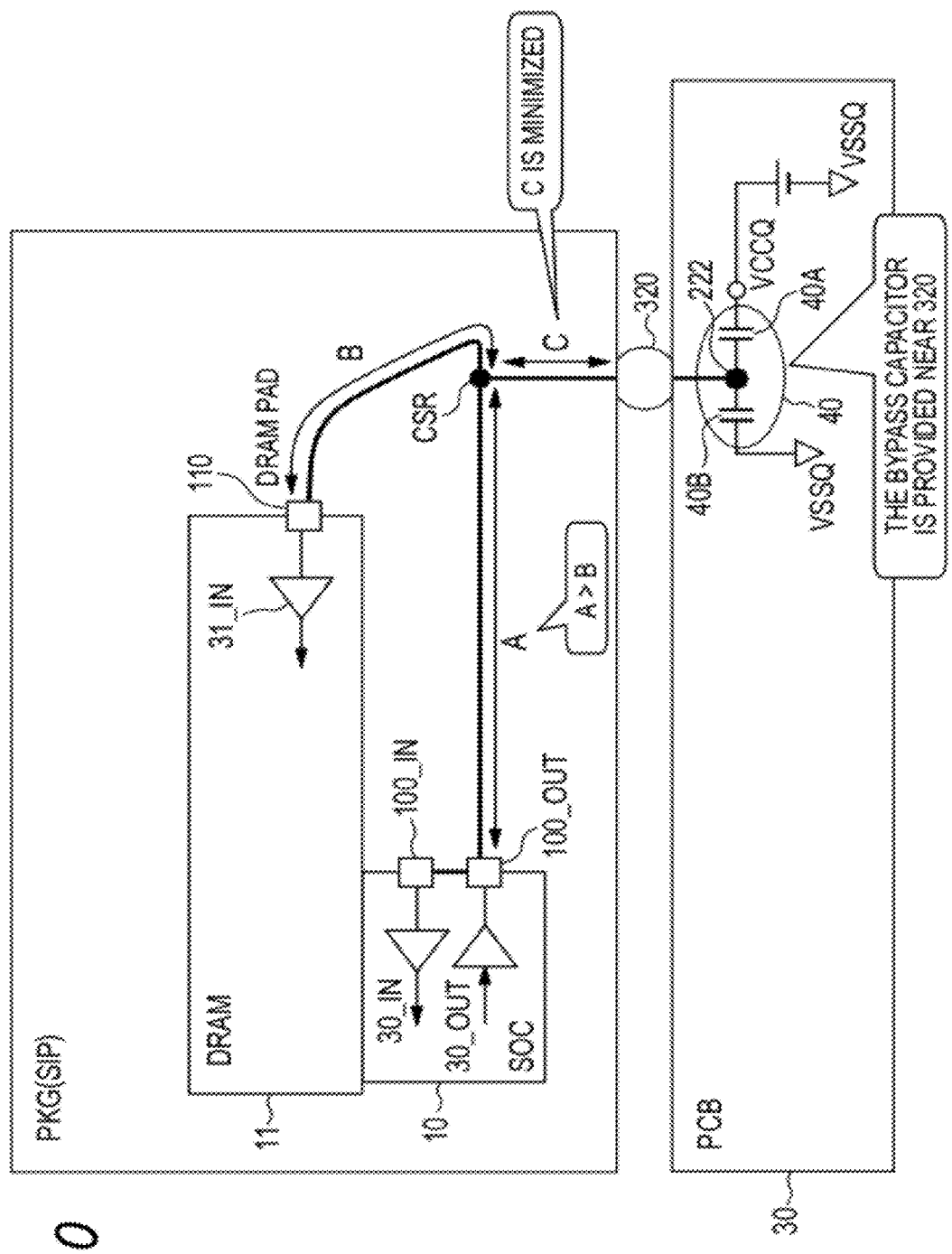
FIG. 10 is an explanatory diagram schematically showing a signal path from a first reference potential pad 100 to a second reference potential pad 110.

FIG. 10 schematically shows a signal path from the first reference potential pad 100 to the second reference potential pad 110. FIG. 10 also shows configurations not clearly shown in FIGS. 8 and 9. The first reference potential pad 100 includes the first reference potential output pad 100_OUT and the first reference potential input pad 100_IN. The first reference potential output pad 100_OUT is connected to an output terminal of the output buffer 30_OUT that outputs the reference potential Vref. The first reference potential input pad 100_IN is connected to an input terminal of the input buffer 30_IN. The adjacent pads 100_OUT and 100_IN are connected to the electrode 200 (or 204 in FIG. 9) in common. An input terminal of the input buffer 31_IN is connected to the electrode pad 110 of the memory chip 11 that receives the reference potential. The bypass capacitor 40 for reference potentials includes the first bypass capacitor 40A and the second bypass capacitor 40B. The first bypass capacitor 40A is provided between the electrode 222 connected to the signal path for reference potentials and the power supply terminal VCCQ. The second bypass capacitor 40B is provided between the electrode 222 and the ground terminal VSSQ (ground plane GND). The input buffer 30_IN is connected to a self-test circuit for the reference potential Vref, though not limited thereto.

The via 401 and the via wiring 411 are connected to each other at the branch point CRS in FIG. 10 along the wiring 500 (503) as the signal path from the first reference potential pad 100 to the second reference potential pad 110. The connecting part on the signal path for transmitting the reference potential Vref satisfies the same condition as that described in the first embodiment. That is, the via 401 and the via wiring 411 are connected to a position on a signal path from the first reference potential pad 100 to the second reference potential pad 110 so as to satisfy the following condition. On the signal path, the via wiring 411 is connected to the wiring 500 only at the position where a distance from the connecting part to the second reference potential pad 110 is shorter than a distance from the connecting part to the first reference potential pad 100. In FIG. 10, the condition can be expressed as A>B. It is desirable to minimize C. It is also desirable to provide the bypass capacitor 40 near the external terminal 320.

The other points on the SIP-structured semiconductor devices 2 and 3 according to the second embodiment are equal to those on the POP-structured semiconductor device 1 according to the first embodiment. The above-mentioned variations are applicable to the semiconductor devices 2 and 3 without change. The semiconductor devices 2 and 3 provide the same effect as the semiconductor device 1 except the usage specific to the base structure of the POP-structured base substrate described in the first embodiment. The other points are equal to the first embodiment and a detailed description is omitted for simplicity.

Third Embodiment

Figure 11:
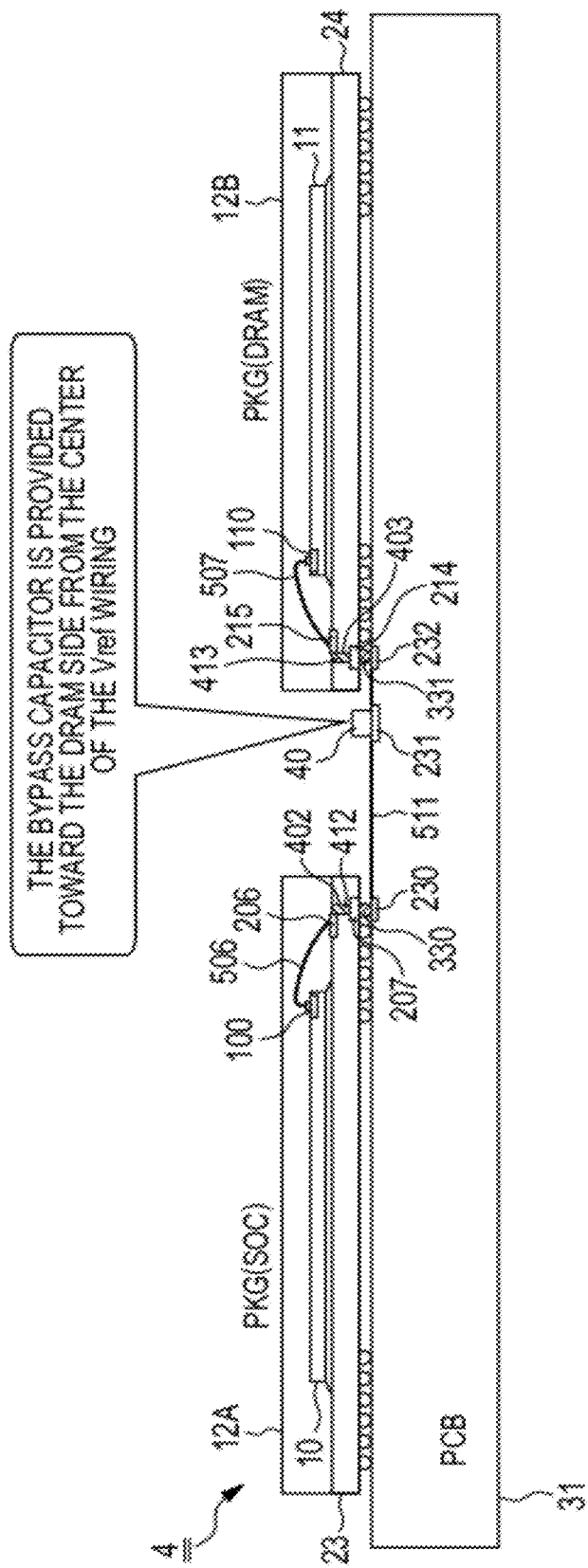
FIG. 11 is a cross sectional view of an electronic device including a memory device and a system-on-chip microcomputer device that are independently packaged and lay-flat mounted on a motherboard.

FIG. 11 exemplifies a cross sectional view of an electronic device including a memory device and a system-on-chip microcomputer device that are independently packaged and lay-flat mounted on a motherboard. An electronic device 4 shown in FIG. 11 includes a motherboard 31 where a microcomputer device 12A and a memory device 12B are lay-flat mounted. The microcomputer device 12A as a semiconductor device includes the control chip (SOC) 10 mounted on a package substrate 23 as the wiring substrate or the mounting substrate. The memory device 12B as a semiconductor device includes the memory chip (DRAM) 11 mounted on a package substrate 24 as the wiring substrate or the mounting substrate. The memory chip 11 and the control chip 10 are equal to those described in the first embodiment. The reference potential Vref is specified as VCCQ/2 if the power supply voltage is defined as VCCQ. The control chip 10 internally generates the reference potential Vref and supplies it to the memory chip 11 so that the memory chip 11 can determine logical values of an interface signal. The following describes the structure of the semiconductor device 4 mainly based on the configuration for transmitting the reference potential Vref.

The package substrate 23 is designed as a BGA (Ball Grid Array) package substrate, for example, and includes multiple wiring layers. Different wiring layers such as a wiring layer on the surface and a wiring layer on the reverse side are electrically connected to each other through a via 402 and a via wiring 412 formed inside the via 402 as representative examples. The surface of the package substrate 23 is provided with an electrode 206 as a representative example. The electrode 206 is connected to the electrode pad 100 of the control chip 10 through a conductive member such as a bonding wire 506. Wiring extends from the electrode 206 and is connected to a electrode 207 on the reverse side through the via 402 and the via wiring 412. An external terminal 330 such as a solder bump is formed at the electrode 207 in order to mount the microcomputer device 12A on a specified wiring pattern of the motherboard 31.

The package substrate 24 is designed as a BGA (Ball Grid Array) package substrate, for example, and includes multiple wiring layers. Different wiring layers such as a wiring layer on the surface and a wiring layer on the reverse side are electrically connected to each other through a via 403 and a via wiring 413 formed inside the via 403 as representative examples. The surface of the package substrate 24 is provided with an electrode 215 as a representative example. The electrode 215 is connected to the electrode pad 110 of the memory chip 11 through a conductive member such as a bonding wire 507. Wiring extends from the electrode 215 and is connected to a electrode 214 on the reverse side through the via 403 and the via wiring 413. An external terminal 331 such as a solder bump is formed at the electrode 214 in order to mount the memory device 12B on a specified wiring pattern of the motherboard 31.

The electrode pad 100 as a representative example is included in the control chip 10 and is provided as a first reference potential pad supplied with a reference potential generated from the reference potential generation circuit. The electrode 206 is connected to the electrode pad 100 through the bonding wire 506 and is provided as a first reference potential electrode. The electrode pad 110 as a representative example is included in the memory chip 11 and is provided as a second reference potential pad supplied with a reference potential generated from outside. The electrode 215 is connected to the electrode pad 110 through the bonding wire 507 and is provided as a second reference potential electrode. The external terminal 330 connected to the electrode 206 is connected to the electrode 230 on the motherboard 31. The external terminal 331 connected to the electrode 215 is connected to an electrode 232 on the motherboard 31. Reference potential wiring 511 connects the electrodes 230 and 232 and is connected to the bypass capacitor 40 through an electrode 231.

According to the example of FIG. 11, an edge of the external terminal 330 for reference potentials on the microcomputer device 12A faces an edge of the external terminal 331 for reference potentials on the microcomputer device 12B. The bypass capacitor 40 is provided between the facing edges.

Figure 12:
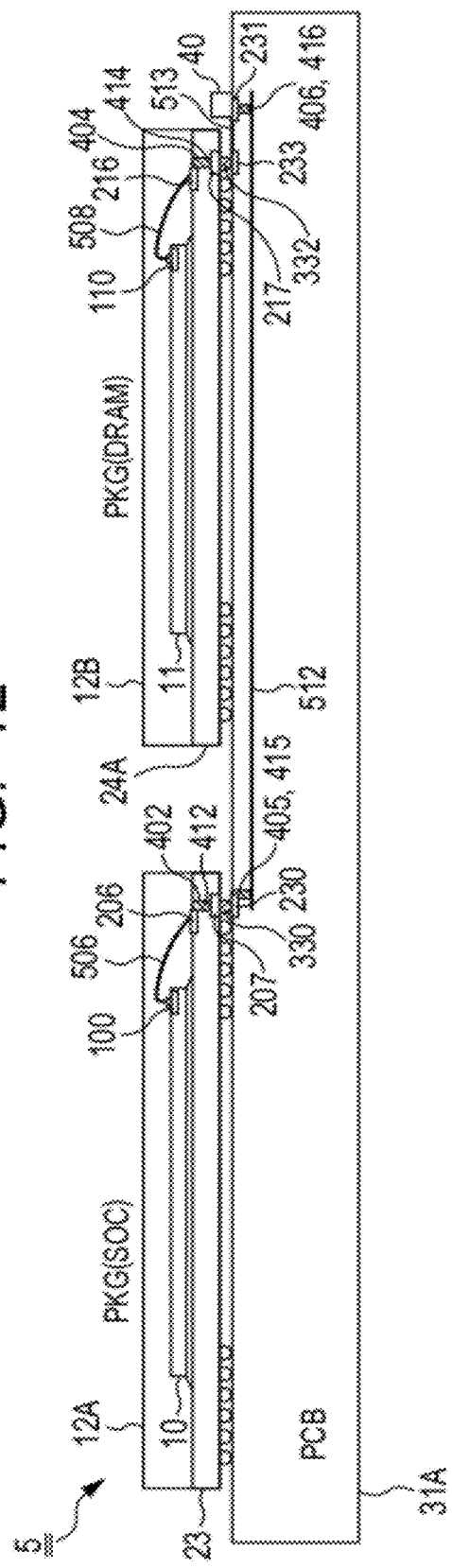
FIG. 12 is a cross sectional view of another electronic device including a memory device and a system-on-chip microcomputer device that are independently packaged and lay-flat mounted on a motherboard.

FIG. 12 exemplifies a cross sectional view of another electronic device including a memory device and a system-on-chip microcomputer device that are independently packaged and lay-flat mounted on a motherboard. An electronic device 5 shown in FIG. 12 differs from the electronic device 4 shown in FIG. 11 in placement of the bypass capacitor 40. The microcomputer device 12A shown in FIG. 12 is equal to that shown in FIG. 11. The memory device 12B differs from FIG. 11 in placement of electrodes. A package substrate 24A is designed as a BGA (Ball Grid Array) package substrate, for example, and includes multiple wiring layers. Different wiring layers such as a wiring layer on the surface and a wiring layer on the reverse side are electrically connected to each other through a via 404 and a via wiring 414 formed inside the via 404 as representative examples. The surface of the package substrate 24A is provided with an electrode 216 as a representative example. The electrode 216 is connected to the electrode pad 110 on the memory chip 11 through a conductive member such as a bonding wire 508. Wiring extends from the electrode 216 and is connected to an electrode 217 on the reverse side through the via 404 and the via wiring 414. An external terminal 332 such as a solder bump is formed at the electrode 217 in order to mount the memory device 12B on a specified wiring pattern of a motherboard 31A.

The control chip 10 includes the electrode pad 100 as a representative example. The electrode pad 100 is provided as a first reference potential pad supplied with a reference potential generated from the reference potential generation circuit. The electrode 206 is connected to the electrode pad 100 through the bonding wire 506 and is provided as a first reference potential electrode. As a representative example, the electrode pad 110 is included in the memory chip 11 and is equivalent to a second reference potential pad that receives a reference potential from outside. The electrode 216 is connected to the electrode pad 110 through the bonding wire 508 and is provided as a second reference potential electrode. The external terminal 330 connected to the electrode 206 is connected to the electrode 230 of the motherboard 31A. The external terminal 332 connected to the electrode 217 is connected to an electrode 233 of the motherboard 31A. The electrode 230 is connected to reference potential wiring 512 in the inner layer through a via 405 and a via wiring 415 formed on the motherboard 31A. The electrode 233 is connected to reference potential wiring 513 on the surface layer of the motherboard 31A. The bypass capacitor 40 is connected to the reference potential wiring 513 through the electrode 231 on the surface layer and is also connected to the reference potential wiring 512 in the inner layer through a via 406 and a via wiring 416.

Figure 13:
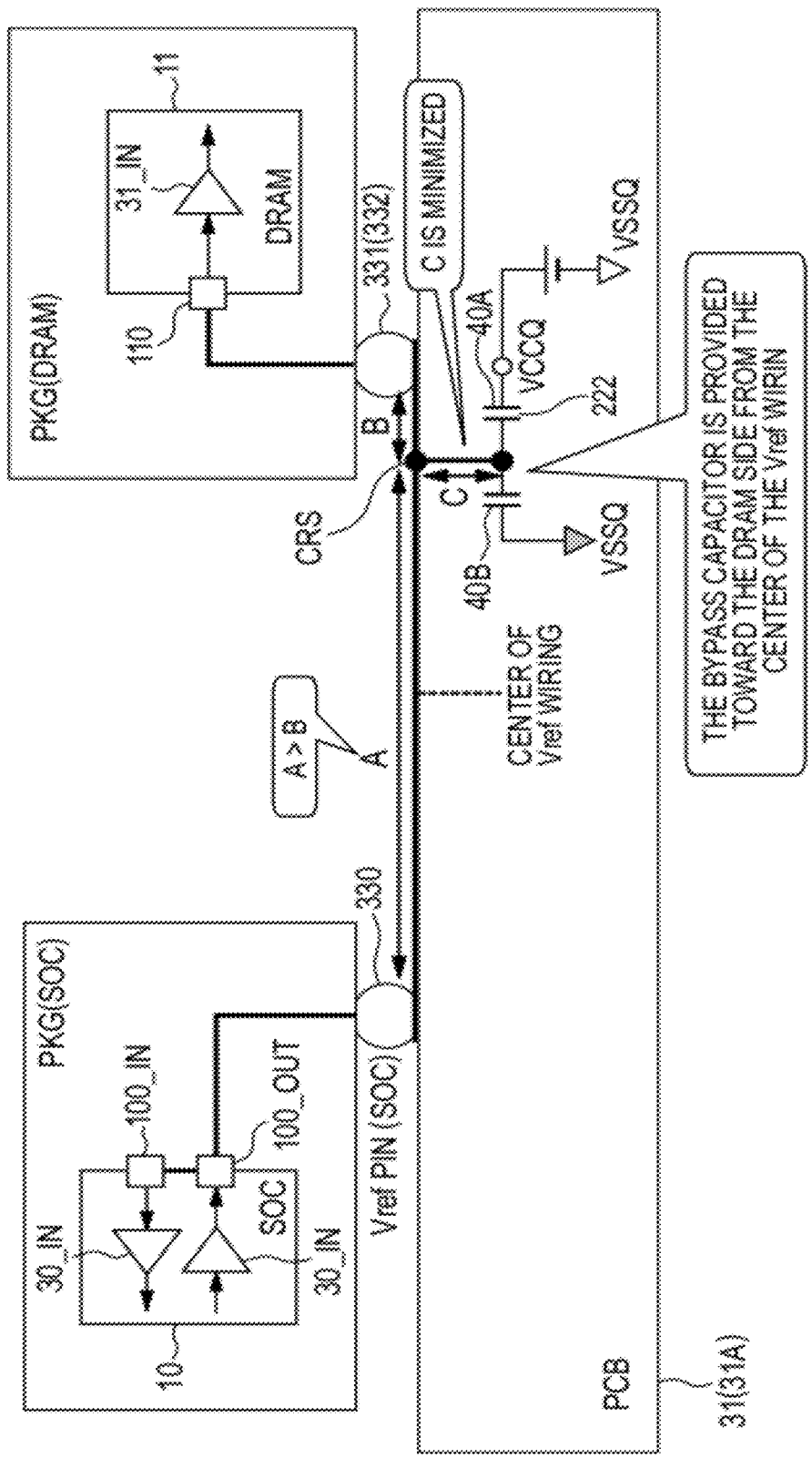
FIG. 13 is an explanatory diagram schematically showing a signal path from a first reference potential pad 100 to a second reference potential pad 110.

FIG. 13 schematically shows a signal path from the first reference potential pad 100 to the second reference potential pad 110. FIG. 13 also shows configurations not clearly shown in FIGS. 11 and 12. The first reference potential pad 100 includes the first reference potential output pad 100_OUT and the first reference potential input pad 100_IN. The first reference potential output pad 100_OUT is connected to an output terminal of the output buffer 30_OUT that outputs the reference potential Vref. The first reference potential input pad 100_IN is connected to an input terminal of the input buffer 30_IN. The adjacent pads 100_OUT and 100_IN are connected to the electrode 206 (216 in FIG. 12) in common. An input terminal of the input buffer 31_IN is connected to the electrode pad 110 of the memory chip 11 that receives the reference potential. The bypass capacitor 40 for reference potentials includes the first bypass capacitor 40A and the second bypass capacitor 40B. The first bypass capacitor 40A is provided between the node 222 connected to the signal path for reference potentials and the power supply terminal VCCQ. The second bypass capacitor 40B is provided between the electrode 222 and the ground terminal VSSQ (ground plane GND). The input buffer 30_IN is connected to a self-test circuit for the reference potential Vref, though not limited thereto.

The branch point CRS in FIG. 13 positionally corresponds to the electrode 231 for the reference potential wiring 511 in FIG. 11 and the electrode 231 for the reference potential wiring 513 in FIG. 12. The connecting part (branch point CRS) on the signal path for transmitting the reference potential Vref satisfies the condition similar to that described in the first embodiment. That is, the electrode 231 is connected to a position on a signal path from the first reference potential pad 100 to the second reference potential pad 110 so as to satisfy the following condition. On the signal path, the electrode 231 is connected only at the connecting part where a distance from the connecting part to the second reference potential pad 110 is shorter than a distance from the connecting part to the first reference potential pad 100. In FIG. 13, the condition can be expressed as A>B. It is desirable to minimize C. It is also desirable to provide the bypass capacitor 40 near the external terminal 320.

Figure 14:
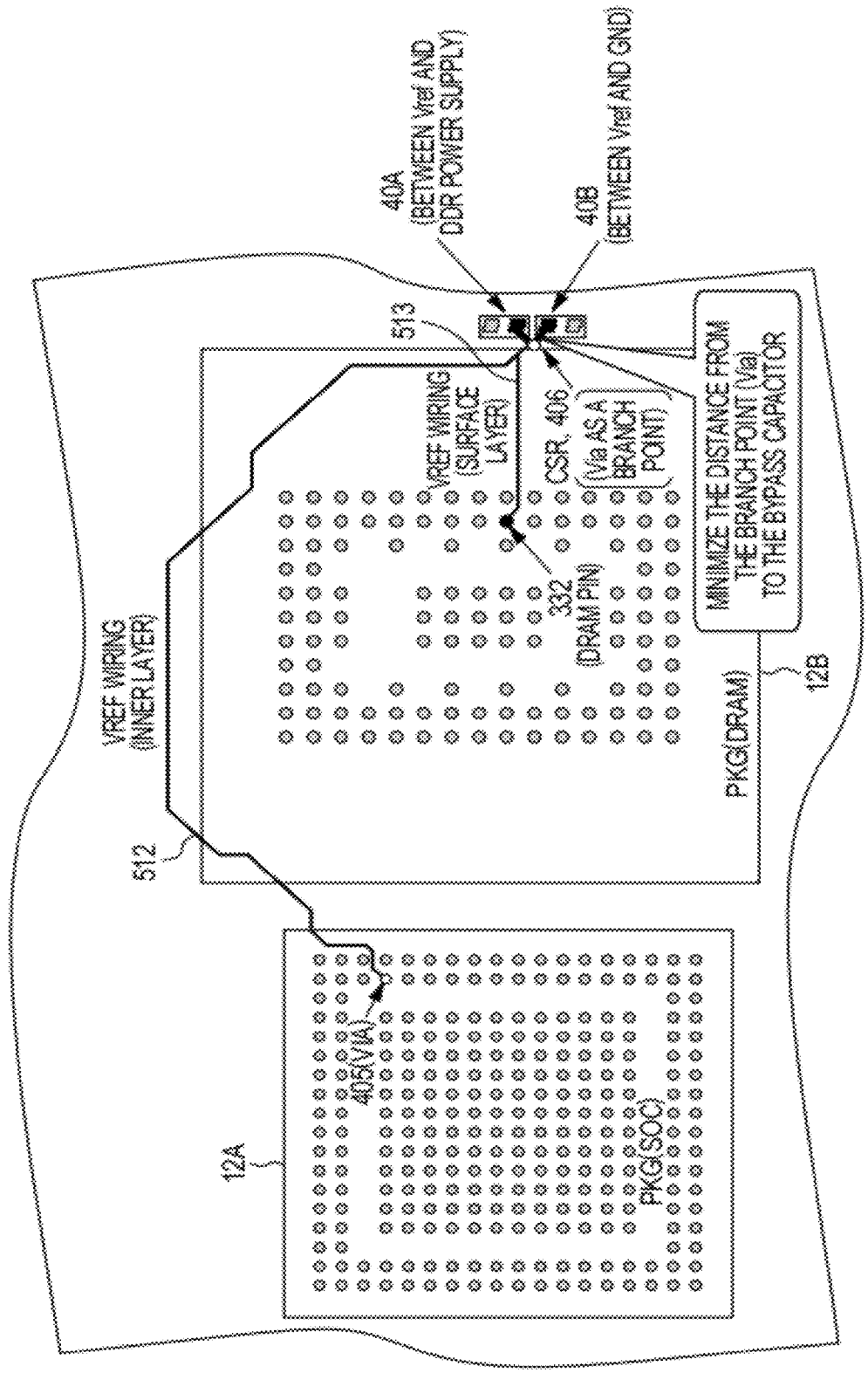
FIG. 14 is an explanatory diagram schematically showing a signal path for transmitting the reference potential in an electronic device 5 shown in FIG. 12.

FIG. 14 schematically shows a signal path for transmitting the reference potential in the electronic device 5 shown in FIG. 12.

The other points on the lay-flat mounted semiconductor devices 4 and 5 according to the third embodiment are equal to those on the POP-structured semiconductor device 1 according to the first embodiment. The above-mentioned variations are applicable to the semiconductor devices 4 and 5 without change. The semiconductor devices 4 and 5 provide the same effect as the semiconductor device 1 except the usage specific to the base structure of the POP-structured base substrate described in the first embodiment. The other points are equal to the first embodiment and a detailed description is omitted for simplicity.

While there have been described specific preferred embodiments of the present invention, it is to be distinctly understood that the present invention is not limited thereto but may be otherwise variously embodied within the spirit and scope of the invention.

For example, the control chip just needs to have at least a function of controlling the memory chip and may be equivalent to a memory controller chip such as an SDRAM controller chip, a microcomputer including a memory controller such as an SDRAM controller, an accelerator including a memory controller such as an SDRAM controller, or other system-on-chips for semiconductor data processing.

The memory chip may be equivalent to synchronous SRAM or flash memory limited to SDRAM chips. The memory chip is also applicable to a packaging structure of stacking multiple chips. The reference voltage is not limited to half the power supply voltage. The present invention is not limited to SIP- or POP-structured semiconductor devices, but is also applicable to semiconductor devices each having the memory chip and the control chip that are lay-flat mounted. In such a case, the bypass capacitor need not be mounted on the semiconductor device.

The reference potential loopback configuration in the control chip not only facilitates the self-test function that loops back and verifies the logical value determination level of a data-oriented signal during a device test. The configuration is also applicable to a case where a feedback signal of the reference potential is used to generate timing to determine data read from the memory chip.

What is claimed is:

1. A semiconductor device comprising:
a wiring substrate having an upper surface, a plurality of control chip electrodes formed over the upper surface, a plurality of memory chip electrodes formed over the upper surface, a lower surface opposite the upper surface, a plurality of external terminal electrodes formed over the lower surface, a plurality of vias formed between the upper surface and the lower surface, and a plurality of via wirings formed inside of the vias, respectively, and electrically connecting the control chip electrodes and the memory chip electrodes with the external terminal electrodes, respectively;
a control chip having a reference potential generation circuit, a chip front surface, a plurality of electrode pads formed over the chip front surface, a chip rear surface on the opposite side of the chip front surface, and mounted over the upper surface of the wiring substrate;
a plurality of conductive members electrically connecting the electrode pads of the control chip with the control chip electrodes, respectively; and
a plurality of external terminals connected to the external terminal electrodes of the wiring substrate, respectively,
wherein the electrode pads have a first reference potential pad electrically connected to the reference potential generation circuit,
wherein the control chip electrodes have a first reference potential electrode electrically connected to the first reference potential pad of the control chip,
wherein the memory chip electrodes have a second reference potential electrode electrically connected to a second reference potential pad of a memory chip,
wherein a reference potential terminal electrode of the external terminal electrodes, which is electrically connected to a bypass capacitor, is electrically connected to the first reference potential electrode and the second reference potential electrode through a reference potential wiring of wirings formed in the wiring substrate and a reference potential via wiring of the via wirings, respectively, and
wherein the reference potential via wiring is connected only at a connecting part of the reference potential wiring where a distance on the reference potential wiring from the connecting part to the second reference potential electrode is shorter than a distance on the reference potential wiring from the connecting part to the first reference potential electrode.

2. The semiconductor device according to claim 1,
wherein the first reference potential pad includes:
a first reference potential output pad connected to an output terminal of an output circuit that outputs a reference potential generated from the reference potential generation circuit; and
a first reference potential input pad connected to an input terminal of an input circuit that is connected adjacently to the first reference potential output pad.

3. The semiconductor device according to claim 2, further comprising:
a data-oriented pad as the electrode pad for a dataoriented signal,
wherein the first reference potential pad provides a logical value determination level of a data-oriented signal that is input and output through the data-oriented pad.

4. The semiconductor device according to claim 3, further comprising:
a command-address-oriented pad as the electrode pad for a command-address-oriented signal,
wherein the first reference potential pad provides a logical value determination level of a command-addressoriented signal that is output through the command-addressoriented pad.

5. A semiconductor device comprising:
a mounting substrate having a control chip electrode, a memory chip electrode, and an external terminal electrode;
a control chip having a control chip pad connected to the control chip electrode through a conductive member and a reference potential generation circuit and mounted over the mounting substrate; and
a memory chip receiving control from the control chip, having a memory chip pad connected to the memory chip electrode through a conductive member, and stacked on the control chip and mounted over the memory substrate,
wherein the control chip pad includes a first reference potential pad electrically connected to the reference potential generation circuit,
wherein the control chip electrode includes a first reference potential electrode electrically connected to the first reference potential pad,
wherein the memory chip pad includes a second reference potential pad, wherein the memory chip electrode includes a second reference potential electrode electrically connected to the second reference potential pad of the memory chip, wherein the external terminal electrode includes a reference potential electrode electrically connected to a bypass capacitor, wherein the reference potential terminal electrode is connected only at a specified connecting part on a signal path that connects the first reference potential pad and the second reference potential pad, and wherein a distance from the second reference potential pad to the connecting part along the signal path is shorter than a distance from the first reference potential pad to the connecting part along the signal path.

6. The semiconductor device according to claim 5, wherein the first reference potential pad includes:

a first reference potential output pad connected to an output terminal of an output circuit that outputs a reference potential generated from the reference potential generation circuit; and a first reference potential input pad connected to an input terminal of an input circuit that is connected adjacently to the first reference potential output pad.

7. The semiconductor device according to claim 6, further comprising:

a data-oriented pad as the control chip pad for a dataoriented signal, wherein the first reference potential pad provides a logical value determination level of a data-oriented signal that is input and output through the data-oriented pad.

8. The semiconductor device according to claim 7, further comprising:

a command-address-oriented pad as the control chip pad for a command-address-oriented signal, wherein the first reference potential pad provides a logical value determination level of a command-address-oriented signal that is output through the command-address-oriented pad.

\* \* \* \* \*